United States Patent

Nishio et al.

[11] Patent Number: 6,160,275
[45] Date of Patent: *Dec. 12, 2000

[54] SEMICONDUCTOR GATE ARRAY DEVICE

[75] Inventors: Yoji Nishio; Yasuo Kaminaga, both of Hitachi; Isamu Kobayashi, Nishitama-gun; Yoshihiko Yamamoto, Higashimurayama; Nozomi Horino, Tokyo; Kousaku Hirose, Higashimurayama, all of Japan

[73] Assignee: Hitachi, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/692,253

[22] Filed: Aug. 5, 1996

Related U.S. Application Data

[63] Continuation of application No. 08/230,549, Apr. 20, 1994, abandoned.

[30] Foreign Application Priority Data

| Apr. 20, 1993 | [JP] | Japan | 5-93146 |
| Nov. 26, 1993 | [JP] | Japan | 5-321345 |

[51] Int. Cl.$^7$ ................................................. H01L 27/10
[52] U.S. Cl. ........................ 257/206; 257/207; 257/208; 257/211
[58] Field of Search ................................... 257/204, 206, 257/207, 208, 211

[56] References Cited

U.S. PATENT DOCUMENTS

| 4,651,190 | 3/1987 | Suzuki et al. | 257/206 |
| 5,083,178 | 1/1992 | Otsu | 257/204 |
| 5,136,356 | 8/1992 | Sakuda et al. | |
| 5,281,835 | 1/1994 | Tomita et al. | 257/204 |
| 5,343,058 | 8/1994 | Shiffer II | 257/211 |
| 5,404,034 | 4/1995 | Yin | 257/206 |

FOREIGN PATENT DOCUMENTS

| 62-150740 | 7/1987 | Japan | 257/204 |
| 1-17241 | 7/1989 | Japan | 257/211 |
| 4-7871 | 1/1992 | Japan | 257/208 |
| 4-132255 | 5/1992 | Japan | 257/206 |
| 4-137761 | 5/1992 | Japan | 257/208 |

Primary Examiner—Ngân V. Ngô
Attorney, Agent, or Firm—Antonelli, Terry, Stout & Kraus, LLP

[57] ABSTRACT

In order to present a basic cell of a master slice type LSI having a high memory density and a high speed logic circuitry, a basic cell is composed of each pair of the PMOS 1, NMOS 4, PMOS 7, and NMOS 10, and three contact holes—besides the contact holes 17, as the contact holes within the MOS channel width W of each MOS, that are connected to the GND power lines 51 and 53, or the Vcc power lines 50 and 52—are formed in the direction perpendicular to each of the power lines. Additionally, in order to present a semiconductor integrated device having a static type RAM that has realized with its simple structure a shortening of the memory cycle, a RAM is constructed by having memory cells, in which each is composed of a pair of transfer MOSFETs, which both of the MOSFETs are turned on during the write-in operation and one of the MOSFETs is turned on during the read-out operation, is located in between a complementary data line and an input/output node that has a complementary relationship with an information storage part comprised by a pair of inverter circuits in which the inputs and outputs are mutually cross-connected. By constructing in this way, it becomes possible to speed up the write-in operation with accuracy by having a complementary write-in signal received from a pair of the complementary lines during the read-out operation, and it becomes possible to obtain read-out signals rapidly and to prevent write-in errors caused by the pre-read-out potential of the data line because the information storage part is connected only to one of the data lines through one of the transfer gates during the read-out operation.

12 Claims, 26 Drawing Sheets

SEMICONDUCTOR GATE ARRAY DEVICE

This is a continuation of application Ser. No. 08/230,549, filed Apr. 20, 1994, now abandoned.

FIELD OF THE INVENTION

The present invention relates to a semiconductor integrated circuit device, and particularly to a semiconductor integrated circuit device of a master slice type that is appropriate for constructing basic cells from CMOS transistors or bipolar transistors; and more particularly, the present invention relates to an effective technology in which the circuit device is utilized in an asynchronous static type RAM (random access memory).

BACKGROUND OF THE INVENTION

Concerning the composition of a semiconductor integrated circuit device, there is known in the art a circuit of a master slice type, previously called a gate array or an embedded array, in which CMOS transistors are formed in a semiconductor device formation layer, then a wiring layer is laid on the semiconductor device formation layer, and then power and signal lines are wired on the wiring layer.

Concerning the composition of a CMOS gate array LSI, a basic cell in which combining a pair of PMOSs and a pair of NMOSs, as described in JPB59-25381, is well known. However, in the case of this basic cell, when constituting a memory circuit, the transistor size is large and the area occupied by memory cells becomes wide.

Additionally, as described in JPA59-150446 and JPA61-268040, there is presented a basic cell constructed by four PMOSs and four NMOSs. However, developing these basic cells into various different kinds of logic gates is difficult.

In order to solve these problems, a small transistor size (FIG. 20) having a contact hole on both sides of the power line, documented in the IEEE 1992 ASIC conference (September, 1992), has been proposed.

However, in the prior art, a memory cell circuit based on an SRAM is constructed; and alternatively, in the case of constructing a complicated macro-cell, like a flip-flop, occupied area becomes large, and channels used in making logic are reduced, and these lead to wire extrusion of the metal wiring of the first layer surface and the second layer surface; and the channel wiring needed for connecting logic circuitry is eradicated. For this purpose, if the metal wiring is automatically wired, unconnected wiring results at various locations, and the utilization factor is lowered.

The first object of the present invention is to provide a semiconductor integrated circuit device, made up of a master slice type LSI of gate array and/or embedded array type having compatible gate speed and memory density as well as having high operational efficiency.

The typical prior art static type RAM memory cell is composed of a latch circuit, in which input and output are alternately connected, and a transfer gate MOSFET, situated between a pair of input/output nodes and a complementary data line, for the address selection purpose. For this kind of memory cell, in a situation of a storage voltage remaining in the complementary data line to which numerous memory cells are commonly connected, if the word line is at the selection level, a write-in error flows into the memory cell. For this reason, a pre-charge of the complementary data line is executed by the clock signal for the synchronized static type RAM and by the timing signal produced by the address signal transform detector circuit (ATD) for the asynchronous static type RAM. A Japanese patent, JPA60-32199, for instance, describes these kinds of static type RAM.

In the above synchronous type, there is a need to set the pre-charge time duration; and in the asynchronous type, because of the countermeasure for the skew of address and the necessity for pulse width maintenance and pulse width fitting for the pre-charge time duration, the reduction of memory cycle or, in other words, the speed-up of memory access is prevented.

In order to solve these problems, the second object of the present invention is to provide a semiconductor integrated circuit device which has realized a reduction of memory cycle through a simplified static type RAM structure.

Further objects and novel features of the present invention as well as those presented above will become apparent from a consideration of the ensuing description and drawings.

SUMMARY OF THE INVENTION

Concerning a semiconductor integrated circuit device, wherein a semiconductor device formation layer is layered on top of a circuit substrate, a wiring layer is laid on top of the semiconductor device formation layer, semiconductor devices, PMOSs and NMOSs, are formed in the semiconductor device formation layer, and a power and a signal line are wired on the wiring layer, and contact holes are formed to connect the electrodes of the semiconductor devices to the wiring layer. To realize the first object of the present invention, the semiconductor integrated circuit device of the present invention has each electrode gate of PMOSs and NMOSs formed on the semiconductor device formation layer in the direction perpendicular to the power line, and has three contact holes formed in the direction perpendicular to the power line within the width of the MOS channel, in addition to the contact hole connected to the power line of the signal line width in the semiconductor device formation layer of PMOSs and NMOSs.

For manufacturing the above mentioned semiconductor integrated circuit device, in regard to the contact holes within the MOS channel width, the contact holes situated on both sides of the power line and, within these contact holes, the contact hole adjoining one side of the power line are formed in the direction perpendicular to the power line.

Concerning the aforementioned semiconductor integrated circuit device, when forming the semiconductor devices in the semiconductor device formation layer, two-PMOS units, as a smallest unit of a P-type semiconductor device (two PMOSs grouped together), are formed along the power line; and in contrast to the two-PMOSs, two-NMOS units, as a smallest unit of an N-type semiconductor device (two NMOSs grouped together), which is placed adjoining the two-PMOS unit in the direction perpendicular to the power line, are formed in the direction of the power line.

Furthermore, concerning the formation of the semiconductor devices in the semiconductor device formation layer, the two-PMOS units, as the smallest unit of a P-type semiconductor device, are formed along the power line, and the two-NMOS units that are the smallest unit of N-type semiconductor device, and which are placed adjoining the two-PMOS units in the direction perpendicular to the power line, are formed in the direction of the power line, and the smallest unit of PMOSs and the smallest unit of NMOSs forms a pair, and two of this pair are organized as a basic cell.

In this instance, a circuit is constructed on a pair-wise basis of the basic cell, and each pair of semiconductor circuits can be connected in parallel via the wiring layer.

Furthermore, in the case of the pair of semiconductor devices being distributed in the direction perpendicular to the power line and constituting a basic cell, the length of the basic cell, perpendicular in direction to the power line, is desired to be set to 24 to 30 wiring pitches on the wiring layer.

Moreover, in the case of distributing the semiconductor devices that compose the basic cell along the direction perpendicular to the power line, the devices can be placed in the order of PMOS-NMOS-PMOS-NMOS, or NMOS-PMOS-NMOS-PMOS, or PMOS-NMOS-NMOS-PMOS, or NMOS-PMOS-PMOS-NMOS.

Furthermore, each of gate electrodes of a pair of the PMOS and NMOS transistors, the semiconductor devices that compose the basic cell, can be connected together. On the other hand, depending on the circuit structure, the electrodes of the PMOS and NMOS gates can be separated from each other.

Additionally, in the case of arranging the semiconductor devices that compose the basic cell along a plurality of power lines, for a pair of basic cells, either a substrate or one domain of diffusion layer areas of a fixed electrical potential well can be provided. Furthermore, for constructing a basic cell, besides PMOSs and NMOSs, a bipolar transistor can be used as a semiconductor device.

According to the methods described above, since the contact holes are made on both sides of the power line of the signal line width and because reserve contact holes are also made, even in the case of constructing a complicated logic circuit, the wire extrusion in the wiring layer can be suppressed, and the channel lines used for the connections in the logic circuit are not eradicated, and thus the utilization factor can be increased. Additionally, since two pairs of the pair of PMOSs and NMOSs with ½ the MOS width size, which is necessary for achieving the desired gate speed, are provided, a circuit is organized pair-wise of basic cells; and when the pair of semiconductor devices are connected in parallel, the desired speed can be obtained. Therefore, both the speed-up of the gate speed and the increase of memory density can be achieved.

In order to achieve the second object of the present invention, the following description is provided to explain simply the concept that represents the present invention. That is, concerning memory information storage unit that is made up of a pair of inverter circuits having input and output cross-connected, a RAM, located between the input/output node having complementary relationship and the complementary data line, is composed of memory cells of a pair of transfer MOSFETs; and during the write-in operation both of the pair are on the "on" status, and during the read-out operation only one of them is "on."

According to the aforementioned method, it then becomes possible to speed up the write-in operation by having complementary write-in signals received from a pair of complementary data lines during the write-in operation, and because the information storage part is connected to only one of the data lines through one of the transfer gates, the read-out signal can be obtained without the write-in errors associated with the electric potential of the data line before the read-out.

BRIEF DESCRIPTION OF THE DRAWINGS

These and other objects, features and advantages of the present invention will be understood more clearly from the following detailed description with references to the accompanying drawings.

DESCRIPTION OF THE PREFERRED EMBODIMENTS

Figure 1:
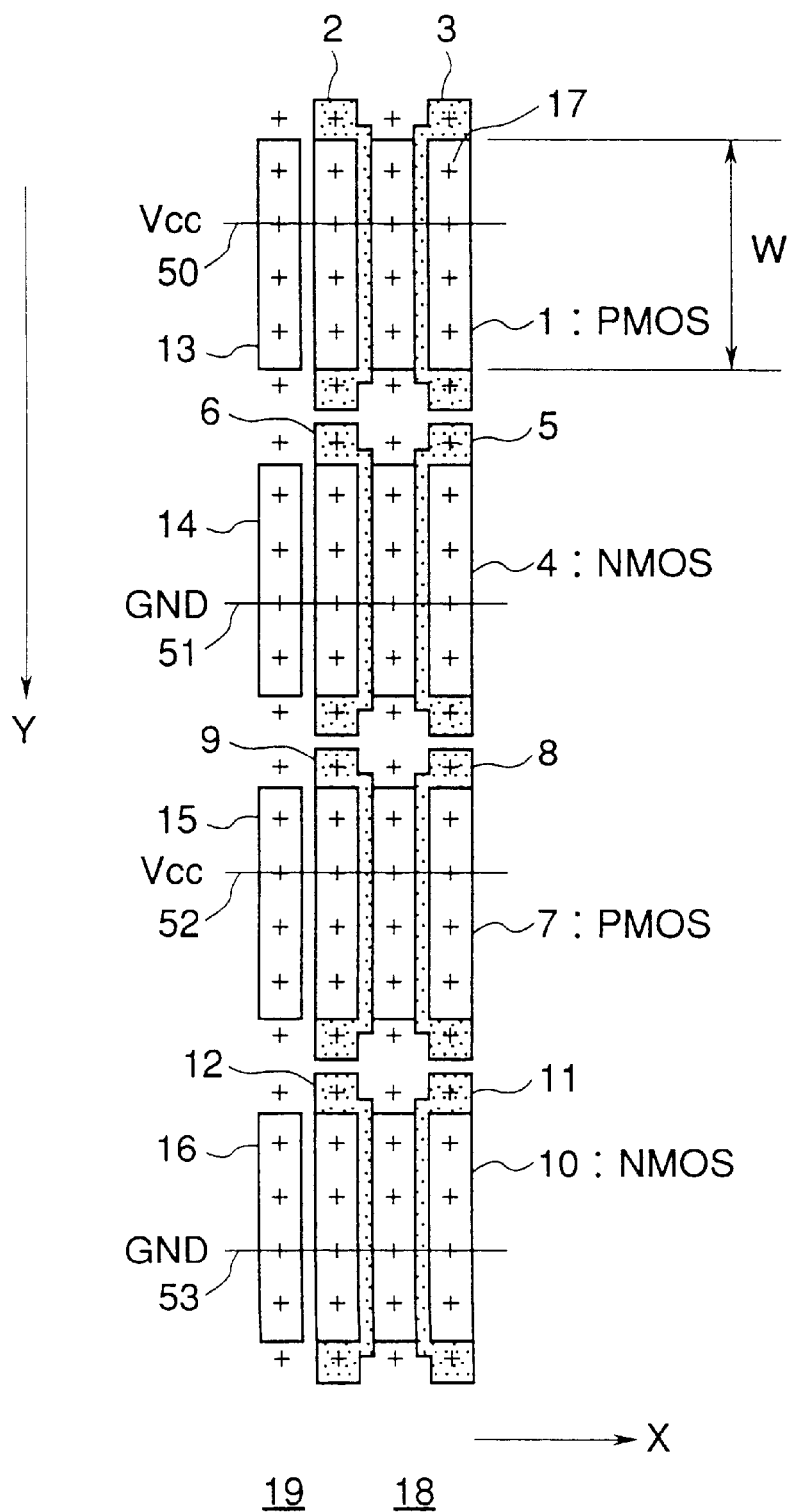
FIG. 1 is one embodiment of the present invention showing a basic cell.

Shown in FIG. 1, a basic cell having a CMOS gate array or an embedded array is composed of the MOS part 18 and the diffusion layer domain part 19. The MOS part 18 has eight MOS transistors specifically, two PMOS transistors 1 (hereinafter a PMOS transistor will be referred to simply as PMOS), two NMOS transistors 4 (hereinafter NMOS transistor will be NMOS), two PMOSs 7, and two NMOSs 10 are arranged along the Y-direction. The gate electrodes 2, 3, 5, 6, 8, 9, 11, 12 of the PMOS 1, NMOS 4, PMOS 7, and NMOS 10 are each arranged separately along the Y-direction. The diffusion layer domain part 19 is composed of the N-type diffusion domain 13, the P-type diffusion domain 14, the N-type diffusion domain 15, the P-type diffusion domain 16; the N-type diffusion domain 13 is formed along the gate electrode 2; the P-type diffusion domain 14 is formed along the gate electrode 6; the N-type diffusion domain 15 is formed along the gate electrode 9; and the P-type diffusion domain 16 is formed along the gate electrode 12. The MOS part 18 and the diffusion domain part 19 are formed in the semiconductor device formation layer on the semiconductor substrate; and the wiring layer for metal wiring is laid on top of the semiconductor device formation layer. The contact holes are formed on the semiconductor device formation layer for connecting each MOS of the semiconductor device formation layer to the metal wiring of the wiring layer.

The possible locations 17 for the contact holes are indicated by "+," and over the "+," the metal wiring of the first layer and the metal wiring of the second layer are wired in the X-direction or the Y-direction. In this instance, for the X-direction or the Y-direction, the interval between one + sign and the following + sign indicates a wiring pitch of one. According to one embodiment of the present invention, four contact holes 17 are formed within the width of the MOS channel. That is, other than the contact holes 17 for wiring the Vcc power lines 50 and 52 and the GND power lines 51 and 53, the contact holes 17 are established on both sides of each power line, and reserve contact holes 17 are also formed. In consideration of the basic cell as a whole, 24 contact holes 17 are formed in the Y-direction (direction in the height of the basic cell).

In the basic cell according to the structure indicated above, the signal lines in the X and Y-directions are wired over the PMOS 1, and the Vcc power line 50, the width being the same as the signal line, is wired as a metal wiring of the first layer in the X-direction. The signal lines are also wired on the NMOS 4 in the X and Y directions, and the GND power line 51, the width being the same as the signal line, is wired as a metal wiring of the first layer in the X-direction. Similarly, the Vcc power line 52 is wired on the PMOS 7 as a metal wiring of the first layer, and the GND power line 53 is wired as a metal wiring on the NMOS 10. These four power lines can be fixed within the basic cell, or according to the need, they can also be wired.

In this way, concerning the embodiment of the present invention, when wiring each MOS to the power line or wiring the signal lines, other than to the domain of the contact holes 17 on both sides of each power line 50 to 53, the signal lines can also be wired to the set locations of reserve contact holes 17 within the width W of the MOS channel; therefore, the extrusion of wiring can be suppressed when metal wiring is done for constructing a logic circuit, and the utilization factor can be increased without eliminating the wiring channel used in the connection of a logic circuit.

Additionally, concerning the embodiment of the present invention, the MOS channel width W has a width set such that one or two contact holes 17 can be formed on both sides of each power line; and the length of the basic cells along the Y-direction is made to be 24 in pitch in considering the gate speed and the ease of the organization of a logic circuit. However, in the case where the gate electrodes between the PMOS and NMOS are separated, the pitch is made to be 20 at the smallest.

Figure 2:
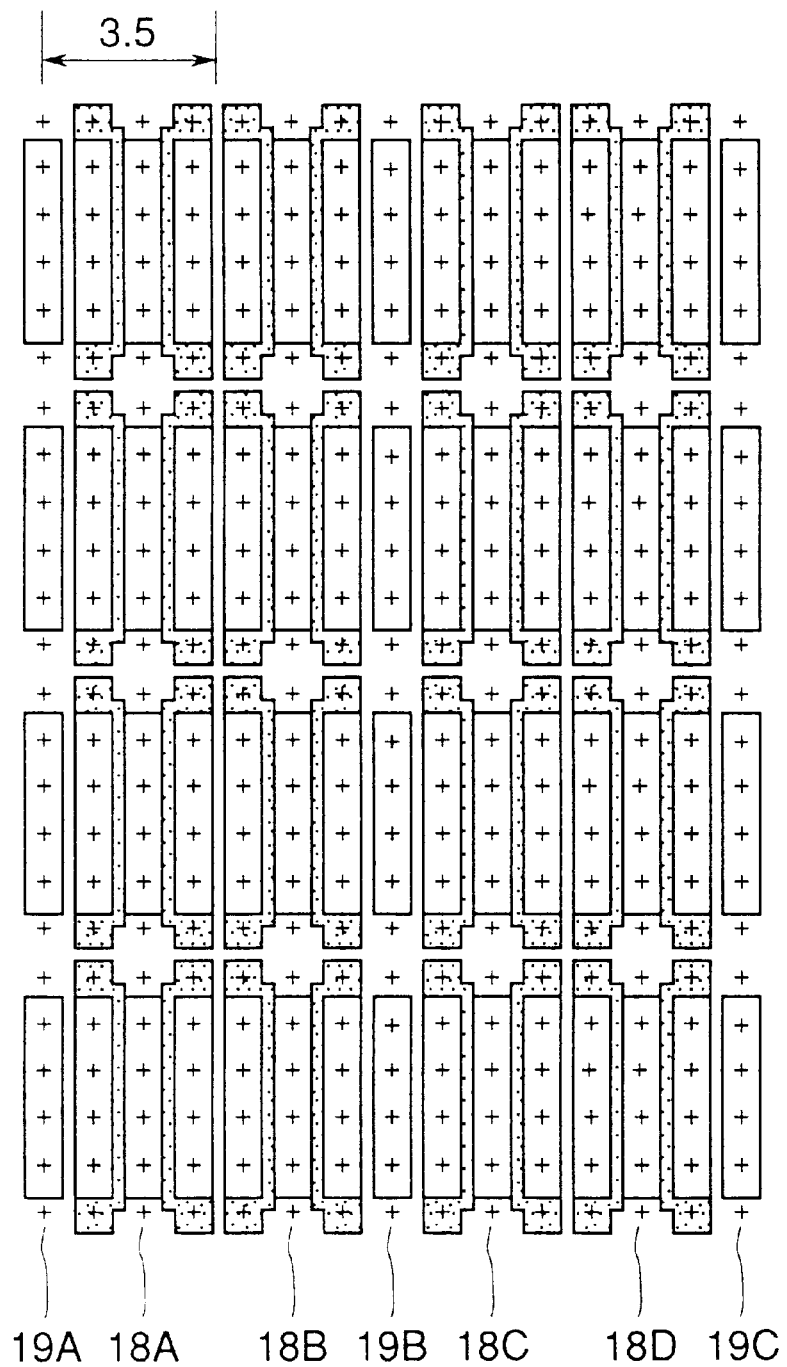
FIG. 2 shows a placement of a plurality of basic cells in the X-direction.

Furthermore, concerning the aforementioned embodiment of the present invention, it was explained for the case of one diffusion layer domain part 19 with one MOS part 18; but as shown in FIG. 2, in the case of placing the basic cells in the X-direction, when structured to have two MOS parts 18 for one diffusion layer domain part 19, the integrated density of a memory cell further increases. The width of the basic cell in this case is 3.5 pitches.

Figure 3:
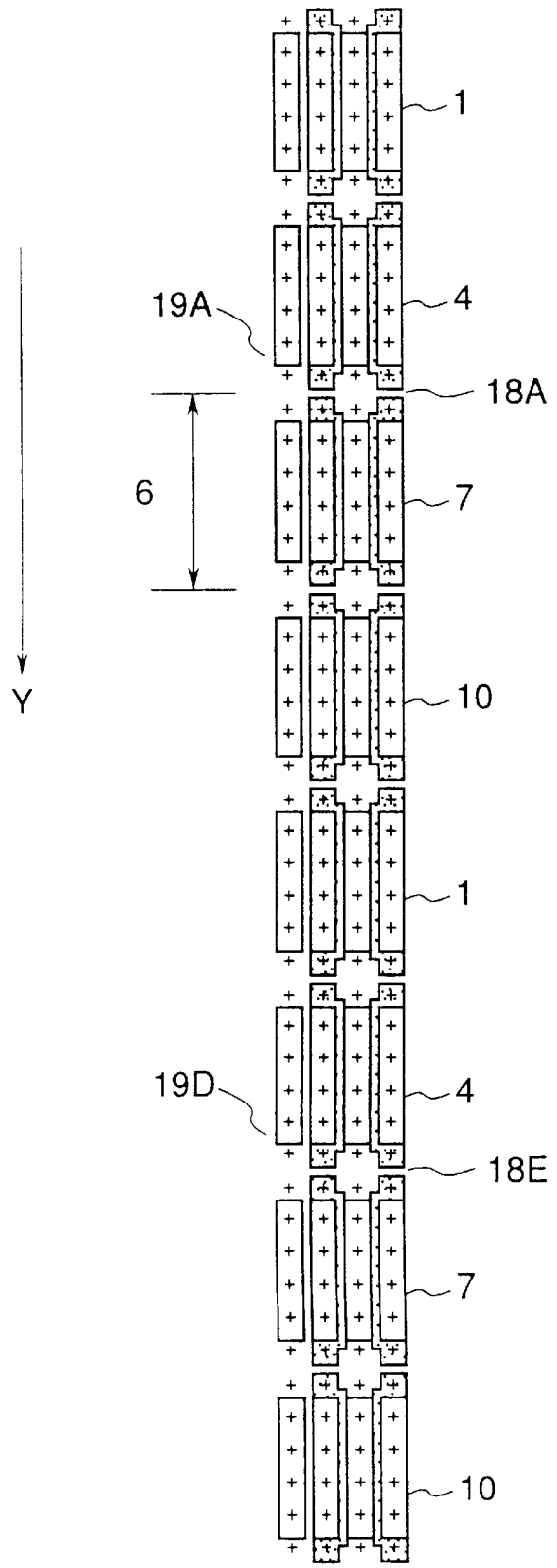
FIG. 3 shows a placement of a plurality of basic cells in the Y-direction.

Moreover, concerning the arrangement of the basic cells, as shown in FIG. 3, the basic cells can be placed in an order along the Y-direction. That is, each of MOSs that compose the basic cell can be ordered in the order of PMOS-NMOS-PMOS-NMOS. In this instance, by separating each gate electrode of the PMOSs and NMOSs, concerning a master chip of the basic cell covering type, the pitch interval of the basic cells in the Y-direction used for a logic gate can be made to be ¼ the pitch of the height of the basic cell. That is, between a PMOS and a NMOS, one of these MOSs is dedicated to be channel wired, and if the basic cells of the other MOSs are organized in between this MOS, the basic-cell-to-basic-cell pitch interval becomes six.

Next, an embodiment of various different memory cell circuits organized efficiently with the basic cell shown in FIG. 1 will be explained through FIGS. 4 to 10.

Figure 4:
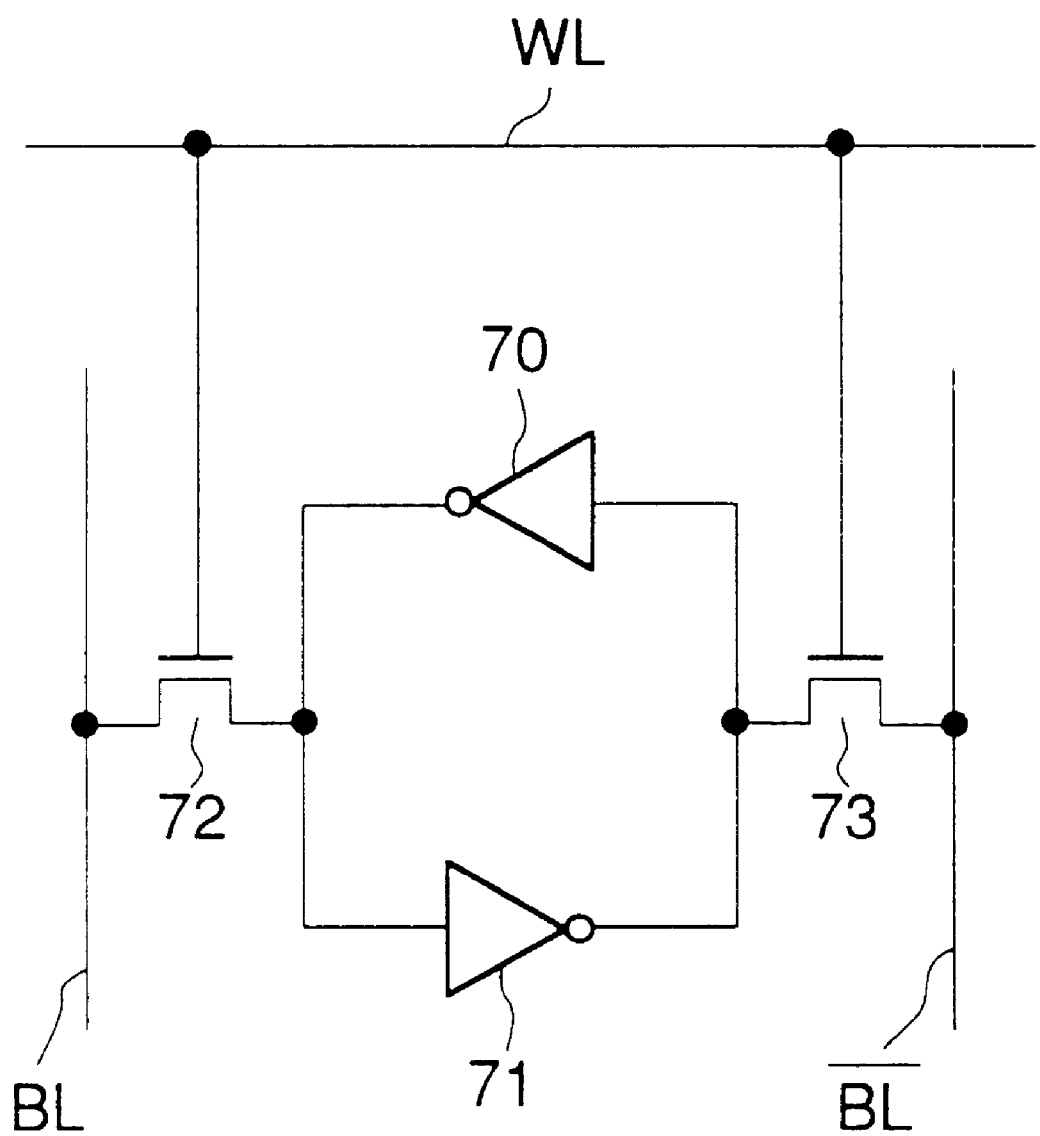
FIG. 4 shows a memory cell circuit for 1-R/W.

FIG. 4 shows a memory cell circuit of 1-R/W (single port-Read/Write) SRAM. This memory cell circuit has a flip-flop composed of two CMOS inverters 70 and 71; the memory data is read out on the bit lines, BL and $\overline{BL}$, through the transfer gates 72 and 73; and the circuit is organized to write-in data in bits. The on/off of the transfer gates 72 and 73 is executed according to the selection of the word line WL.

Figure 5:
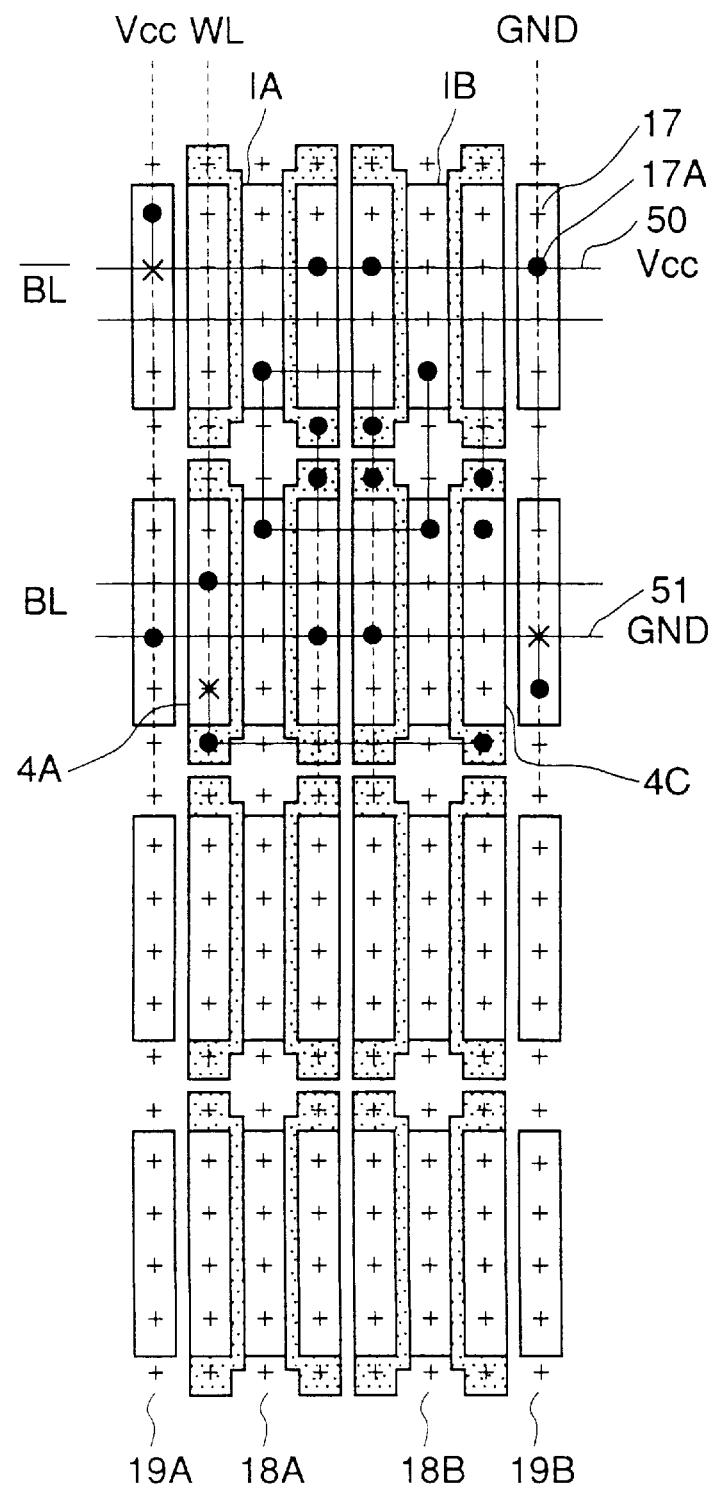
FIG. 5 shows a placement of a memory cell circuit having basic cells for 1-R/W.

FIG. 5 shows placements of the basic cell of FIG. 1 in the arrangement of the memory cell shown in FIG. 4. A memory cell circuit of the present embodiment, concerning the basic cell that is composed of the MOS part 18 and the diffusion domain part 19, has a memory cell of one bit composed by the MOS group placed on the upper half domain of each basic cell. That is, two-PMOS units 1A and 1B, and two-NMOS units 4A and 4B make up the memory cell circuit. The right hand side PMOS of the two-PMOS unit 1A and the right hand side NMOS of the two-NMOS unit 4A compose the CMOS inverter 70. Furthermore, the left hand side PMOS of the two-PMOS unit 1B and the left hand side NMOS of the two-NMOS unit 4B compose the CMOS inverter 71. Moreover, the left hand side NMOS of the two-NMOS unit 4A constitutes the transfer gate 72, and the right hand side NMOS of the two-NMOS unit 4B constitutes the transfer gate 73. Concerning the memory cell that is composed by connecting each MOS, the metal wiring of the first layer, indicated by solid line, and the MOS transistor devices are connected through the contact holes 17A marked by "•." The metal wiring of the first layer and the metal wiring of the second layer, indicated by dashed line, are connected through the through hole marked by "X." Furthermore, the bit lines BL and $\overline{BL}$ are wired in the X-direction by the metal wiring of the first layer, and the word line WL is wired in the Y-direction by the metal wiring of the second layer. Additionally, either the substrate or the diffusion layer domain of the fixed electrical potential well is fixed at the predetermined electrical potential through the through hole (marked by "X") or the contact hole. Furthermore, the Vcc power lines and the GND power lines, both of which are wired in the Y-direction by the metal wiring of the second layer, can be wired in accordance with the need.

Note that in the embodiment of the present invention, the pattern of the memory configuration is not shown at the bottom side of the two basic cells, but it is apparent that the same configuration can be achieved at that location.

In this way, according to the embodiment of the present invention, according to the MOSs in one basic cell, the memory cell circuit for 1-R/W can have one bit configuration without the extrusion of wiring in the metal wiring.

Figure 20:
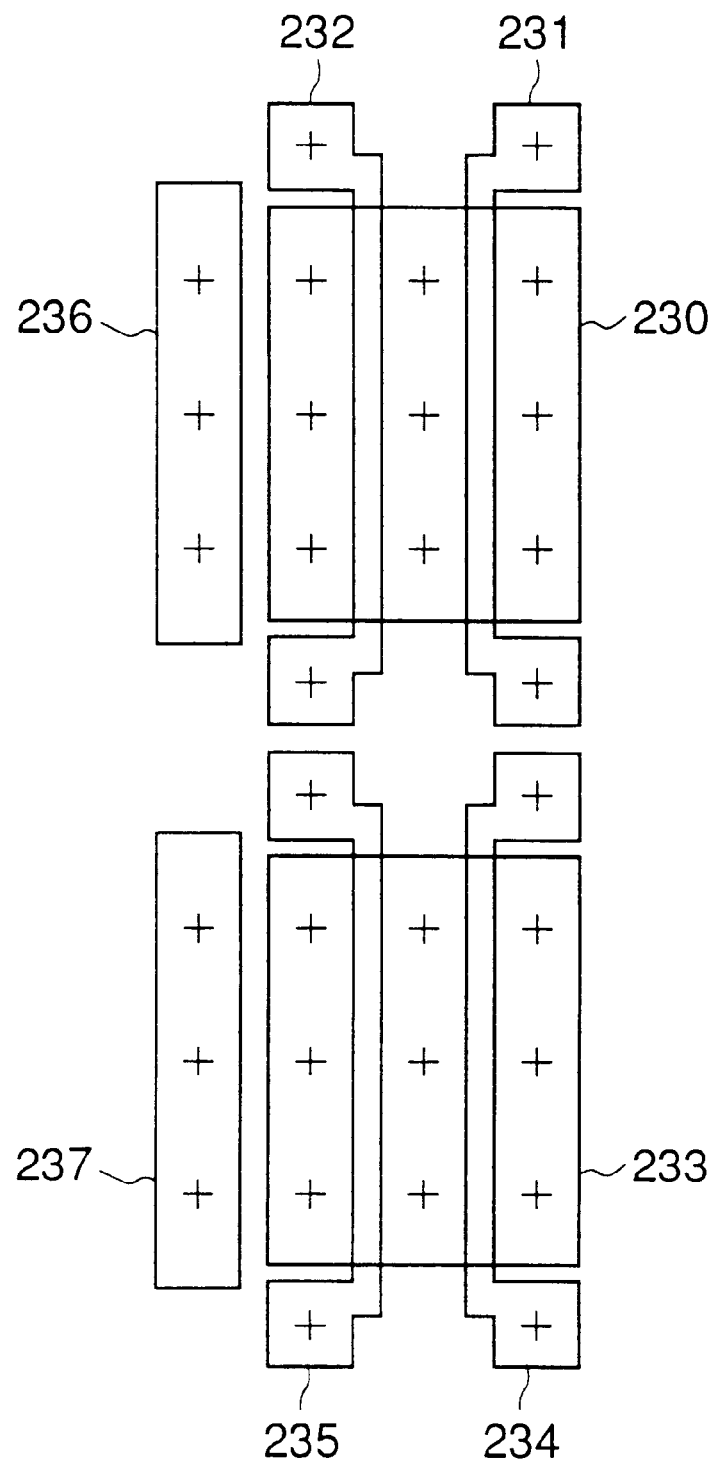
FIG. 20 is a diagram of a basic cell of the prior art.

In contrast, in the prior art, two BCs (BC: basic cell) are necessary in order to have one bit configuration. Additionally, the prior art shown in FIG. 20, one BC is sufficient for one bit configuration, but the bit line has to be wired on the outer side of the power line, and there is a possibility of degrading the characteristic by the influence of the diffusion layer resistance.

Figure 6:
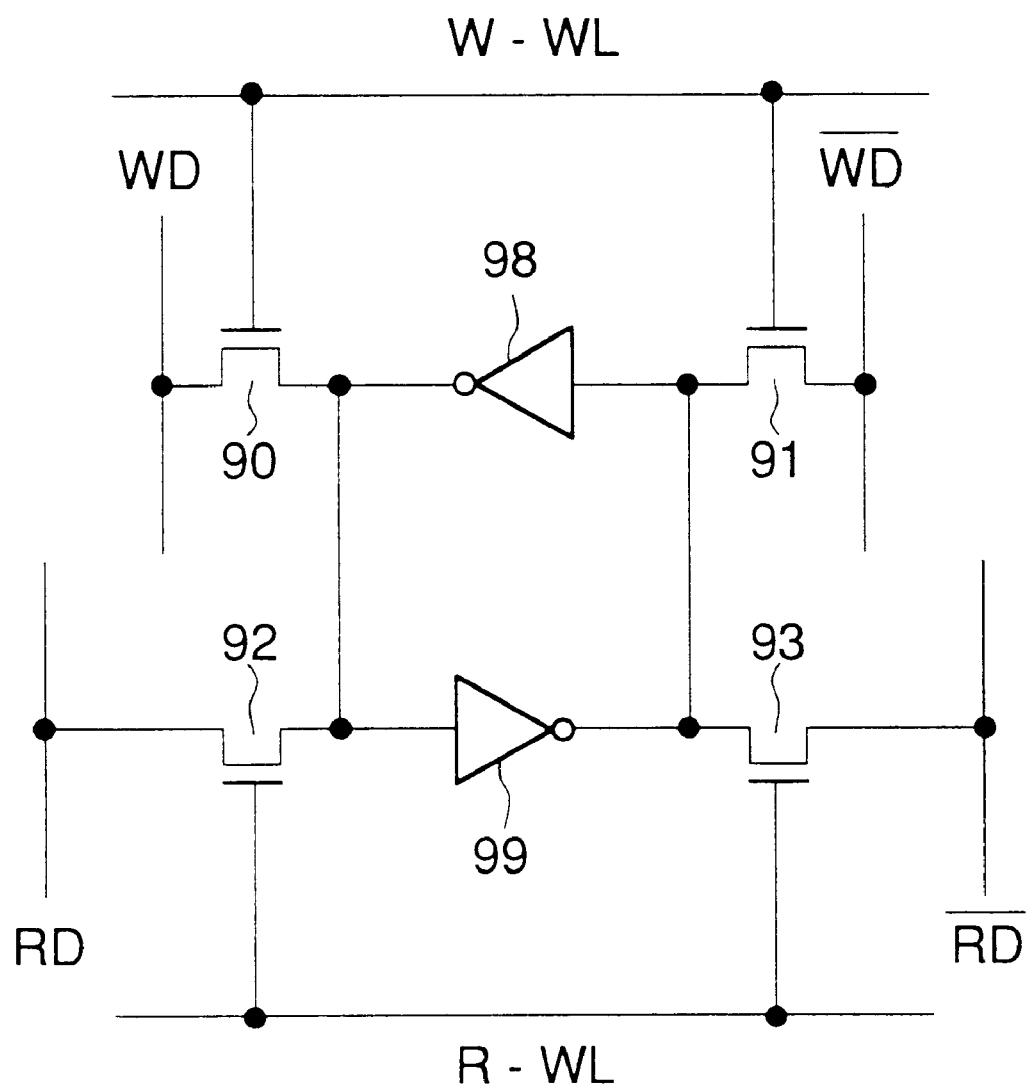
FIG. 6 is a memory cell circuit of two ports.

FIG. 6 is a memory cell circuit of 1R–1W (1 Read–1 write: simultaneous read out and write via two ports) SRAM. The embodiment of the memory cell circuit of the present invention has the two CMOS inverters 98 and 99 composing a flip-flop and is configured so as to read out the memory data RD and $\overline{RD}$, differing at the bit line level, through the transfer gates 92 and 93 and to write out the data WD and $\overline{WD}$, differing at the bit line level, through the transfer gates 90 and 91. The on/off of the transfer gates 92 and 93 is executed by the selection of the read-out word line R-WL; and the on/off of the transfer gates 90 and 91 is executed by the selection of the write-in word line W-WL.

Figure 7:
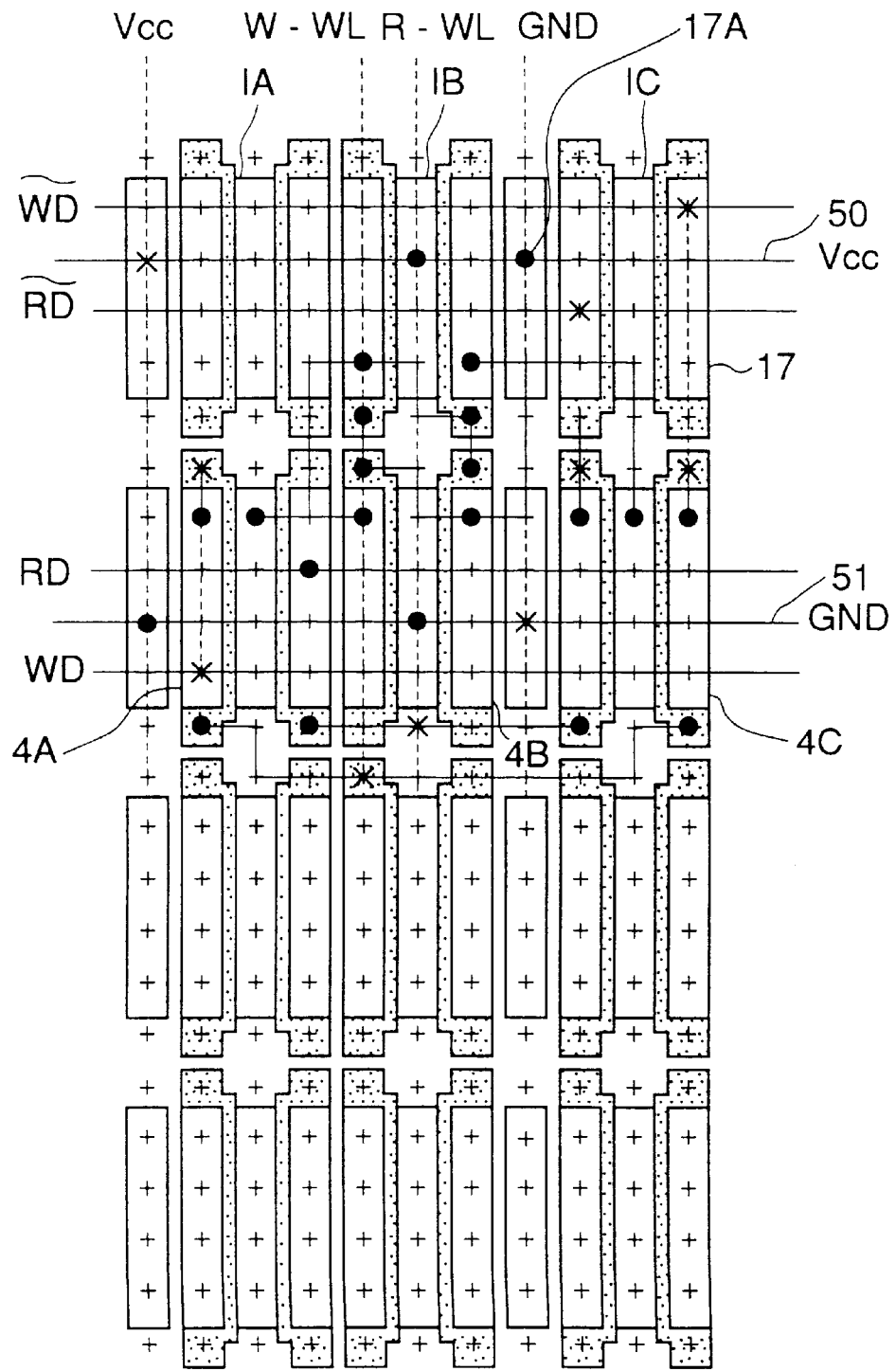
FIG. 7 shows a placement of a two port memory cell circuit having basic cells.

FIG. 7 shows placements of the basic cell of FIG. 1 in the configuration of the memory cell circuit of FIG. 6. This embodiment of the present invention has the semiconductor devices in the upper half of the three basic cells lined up along the X-direction configured to be a one bit memory cell. That is, the memory cell circuit is composed by the two-PMOS units 1A, 1B, and 1C and the two-NMOS units 4A, 4B, and 4C. Two-PMOS unit 1B and two-NMOS unit 4B, that is, a total of four MOSs make up the CMOS inverter 98 and 99. Furthermore, two-NMOS unit 4A comprises the transfer gates 90 and 92; and two-NMOS unit 4C comprises the transfer gates 91 and 93. Concerning the connections of these semiconductor devices, the metal wiring of the first layer, indicated by solid line, and the metal wiring of the second layer, indicated by dashed line, are connected through the through holes marked by "X," and the MOS devices are connected to the metal wiring of the first layer through the contact holes 17 marked by round black dots. Additionally, the write-in word line W-WL and the read-out word line R-RL are wired along the Y-direction as metal wirings in the second layer. Furthermore, the bit line is wired in the X-direction as a metal wiring in the first layer. Either the substrate or at least one of the diffusion layer domains of the fixed electrical potential well is fixed at a predetermined electrical potential through the contact hole. Moreover, the Vcc power lines and the GND power lines are wired in the Y-direction as metal wirings in the second layer. It is possible for these power lines to be wired according to the need. Furthermore, the pattern is not shown at the bottom side of the three basic cells, but it is apparent that the same configuration can be achieved at that location.

According to the embodiment of the present invention, with the 1.5 BCs, the memory cell circuit for 1R–1W can have the one bit configuration without the wire extrusion of the metal wiring.

In contrast, in the prior art, three BCs are necessary in order to have a one bit configuration. Additionally, since four bit lines and two power lines occupy the MOS channels in the prior art shown in FIG. 20, it is difficult to achieve a one bit configuration with 1.5 BCs.

Figure 8:
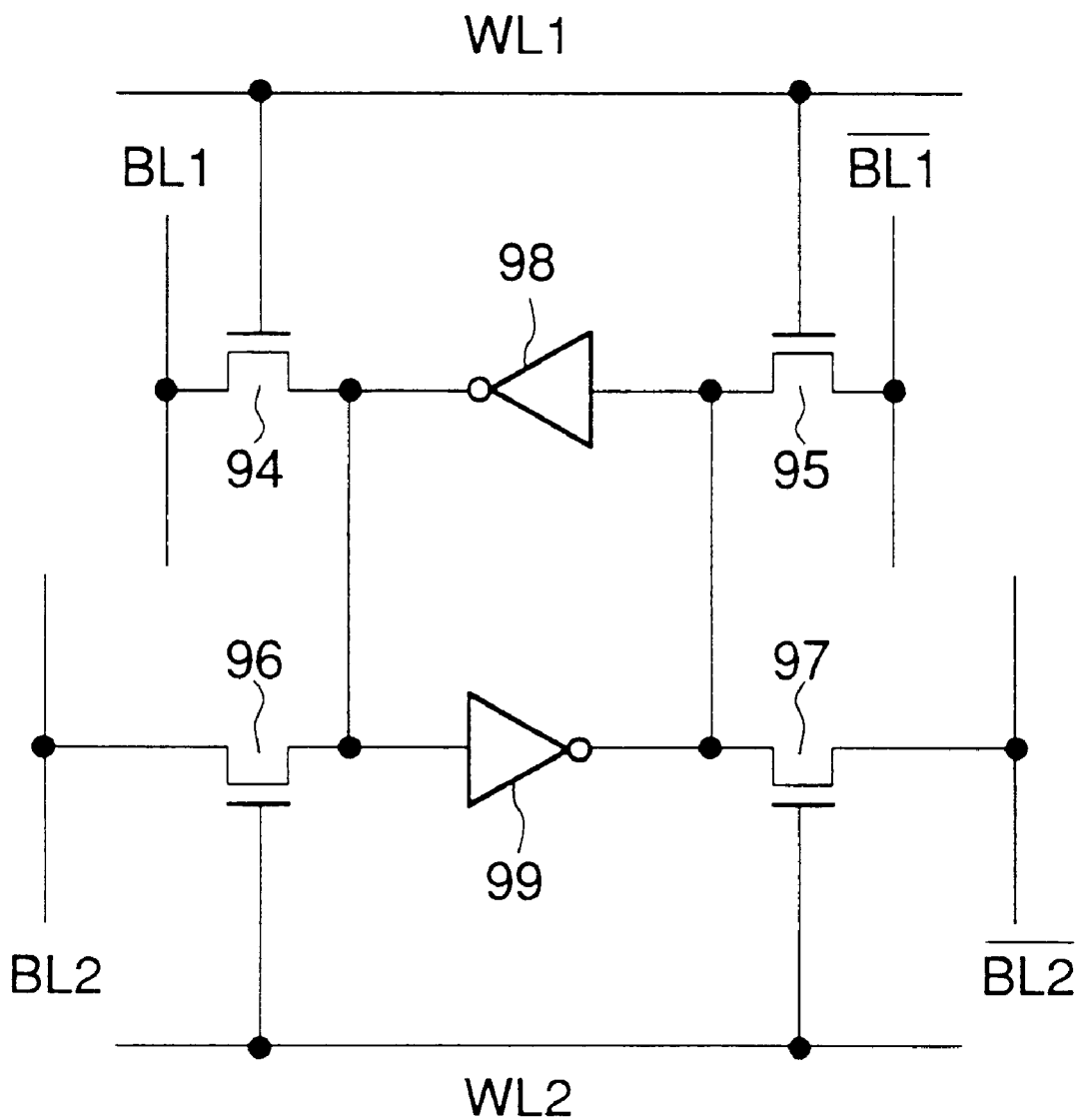
FIG. 8 is a memory cell circuit of dual ports.

FIG. 8 shows a memory cell circuit of 2-R/W (dual ports-read/write) SRAM. This embodiment of the present invention relating to a memory cell circuit has a flip-flop composed of two CMOS inverters 98 and 99 and is configured to read out the memory data on the bit lines, BL1 and $\overline{BL1}$, through the transfer gates 94 and 95 and to write-in the data on the bit lines, BL1 and $\overline{BL1}$. The on/off of the transfer gates 94 and 95 is executed according to the selection of the word line WL1. Furthermore, this embodiment is configured to read out the memory data on the bit lines, BL2 and BL2, through the transfer gates 96 and 97 and to write-in the data on the bit lines, BL2 and $\overline{BL2}$. The on/off of the transfer gates 96 and 97 is executed according to the selection of the word line WL2.

This embodiment of the memory cell circuit of the present invention can be configured using the placement shown in FIG. 7 using the basic cell shown in FIG. 1 because the configuration of the memory cell circuit is the same as that of the memory cell circuit shown in FIG. 6. Therefore, this embodiment can also have the 1.5 BCs such that the memory cell circuit for 2-R/W has the one bit configuration without the wire extrusion of the metal wiring.

Figure 9:
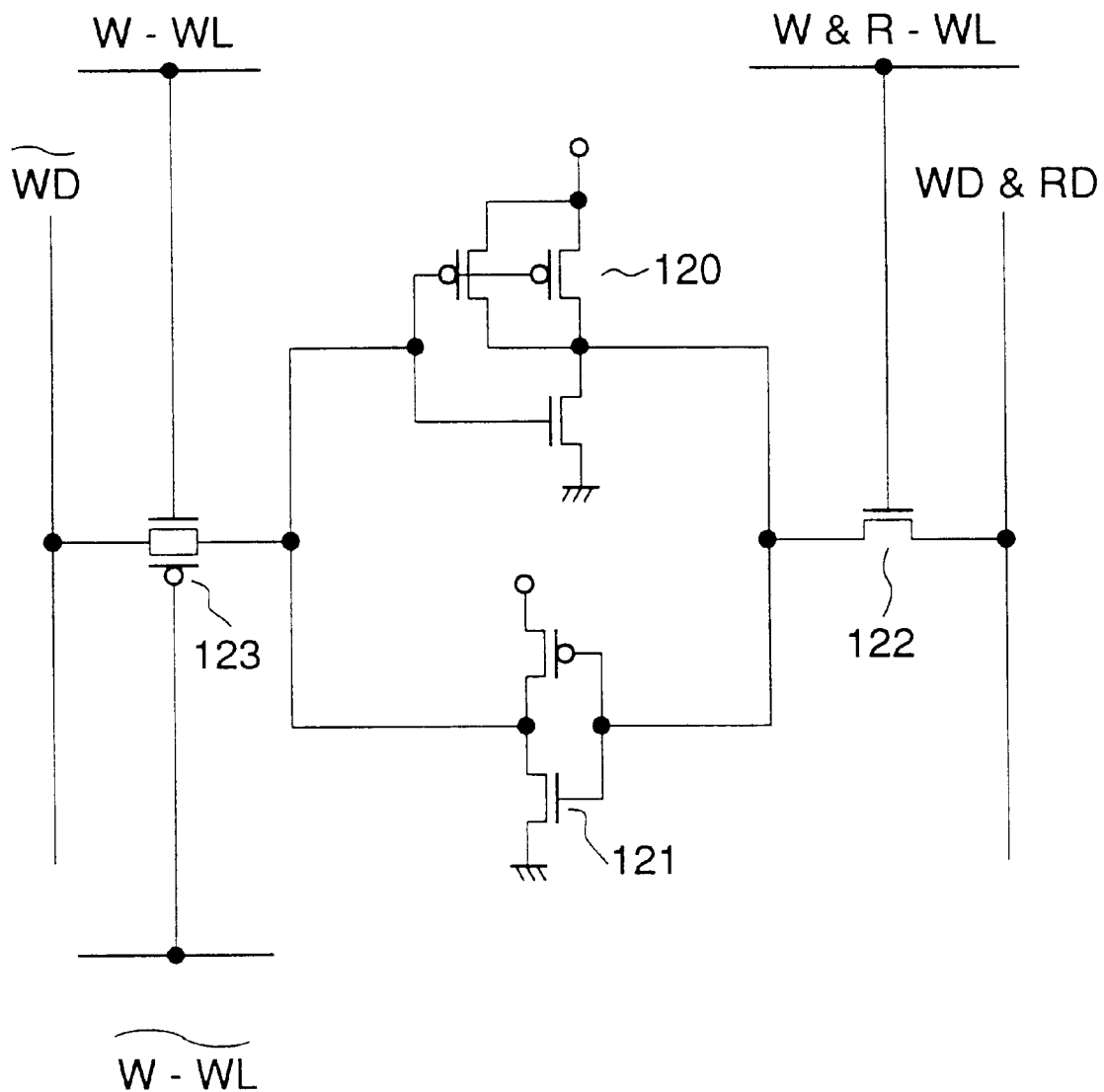
FIG. 9 is a memory cell circuit of a single port.

FIG. 9 shows another memory cell circuit of 1-R/W SRAM. This embodiment of the present invention relating to a memory cell circuit has two PMOSs and one NMOS composing the CMOS inverter 120, one PMOS and one NMOS composing the CMOS inverter 121, and the two CMOS inverters 120 and 121 composing a flip-flop. The memory data is read out over the bit line WD & RD through the transfer gate 122. Furthermore, data is written in over the bit lines WD & RD and WD through the transfer gates 122 and 123. The on/off of the transfer gates 122 and 123 is executed by the selection of the word line WL. That is, for read-out, transfer gate 122 is selected by the W&R-WL. On the other hand, for write-in, the transfer gates 122 and 123 are selected by the W&R-WL, W-WL, and $\overline{W\text{-}WL}$.

Figure 10:
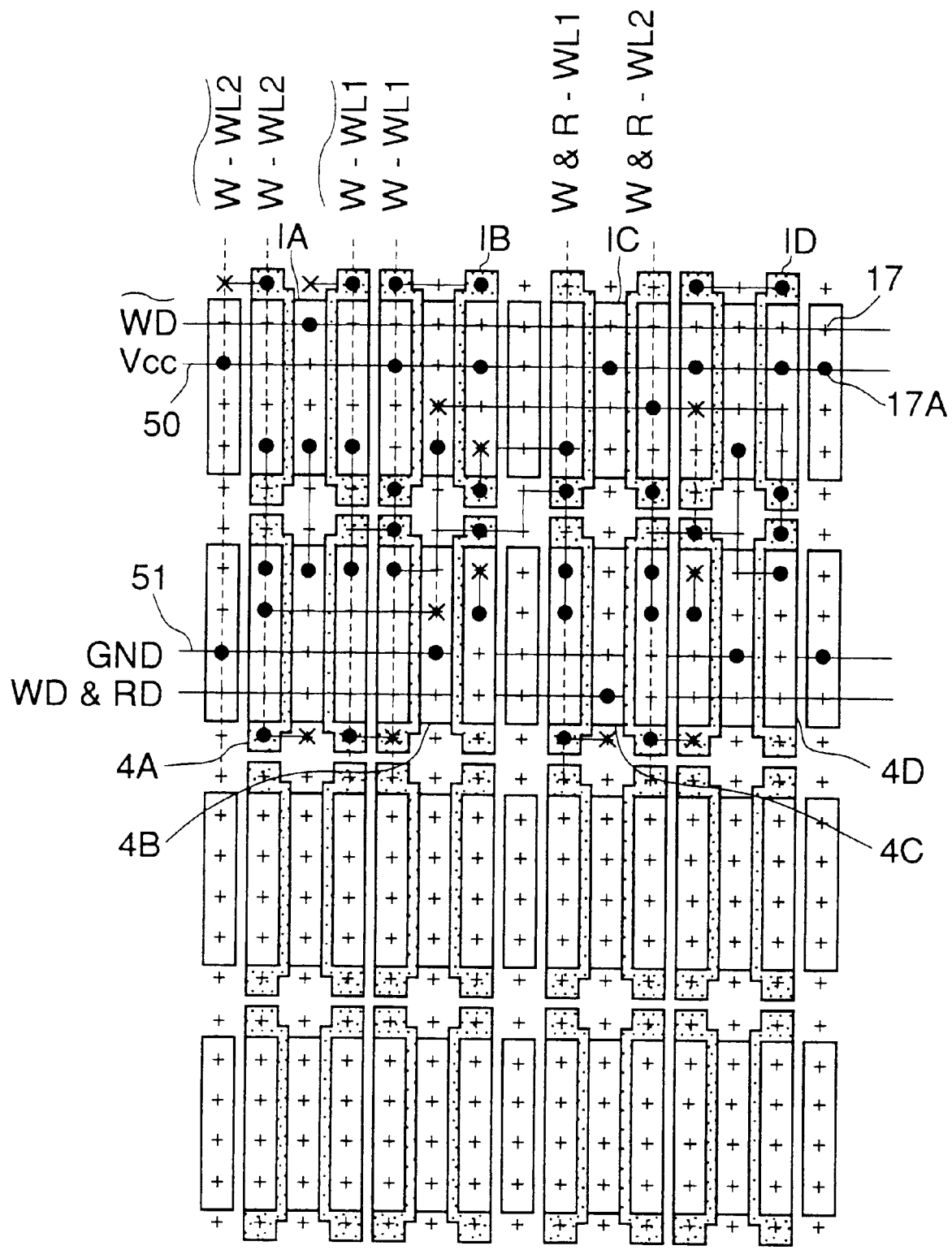
FIG. 10 shows a placement of a single port memory cell circuit having basic cells.

FIG. 10 shows placements of the basic cell of FIG. 1 in the configuration of the memory cell circuit of FIG. 9. This embodiment of the present invention relating to a memory cell circuit has the memory cell, which has the group of MOSs in the upper half of the four basic cells on the substrate in the X-direction connected on the same bit line, configured for two bits. That is, of the four basic cells, the PMOSs 1A, 1B, 1C, and 1D, and the NMOSs 4A, 4B, 4C, and 4D are used in the memory cell circuit. The two-PMOS unit 1B and the left hand NMOS of the two-NMOS unit 4B compose the CMOS inverter 120A; and the left hand PMOS of the two-PMOS unit 1C and the right hand NMOS of the two-NMOS unit 4B compose the CMOS inverter 121A. Additionally, the left hand NMOS of the two-NMOS unit 4C is used for the transfer gate 122; and the right hand NMOS of the two-NMOS unit 4A and the right hand PMOS of the two-PMOS unit 1A compose the transfer gate 123A. Furthermore, the two-PMOS unit 1D and the right hand NMOS of the two-NMOS unit 4D compose the CMOS inverter 120B; and the right hand PMOS of the two-PMOS unit 1C and left hand NMOS of the two-NMOS unit 4D compose the CMOS inverter 121B. Moreover, the right hand NMOS of the two-NMOS unit 4C is used for the transfer gate 122B; and the left hand NMOS of the two-NMOS unit 4A and left hand PMOS of the two-PMOS unit 1A compose the transfer gate 123B.

Concerning the connections of the semiconductor devices, the metal wiring of the first layer, indicated by solid line, and metal wiring of the second layer, indicated by dashed line, are connected through the through holes, and the metal wiring of the first layer and the MOS devices are connected through the contact holes 17. Furthermore, a word line is wired in the Y-direction as a metal wiring of the second layer, and a bit line is wired in the X-direction as a metal wiring of the first layer. Moreover, either the substrate or at least more than one diffusion layer domain of the fixed electrical potential well is fixed at a predetermined electrical potential through the contact holes. In accordance with the need, it is possible to wire the Vcc and GND power lines in the Y-direction at the metal wiring of the second layer.

In regard to this embodiment, in order to decrease the diffusion layer capacity of the transfer gate that is added to the bit line, the diffusion layer domains of the transfer gates that are adjoined over the bit line are made to coexist. That is, the diffusion layer domains of the transfer gates 122A and 122B are shared. This is also true for the diffusion layer domains of the transfer gates 123A and 123B. Furthermore, in order to prevent write-in errors during read-out, the PMOSs of the CMOS inverter 120 are connected in parallel to increase the operational power of the PMOSs. Moreover, in order to execute write-in operation with accuracy, the transfer gate 123 are constructed to have PMOSs and NMOSs connected in parallel. In this embodiment, although the structure pattern of the memory cell is not shown on the bottom side of the four basic cells, it is obvious that the same structure could be placed there.

Therefore, according to the embodiment of the present invention, with one basic cell, a one bit configuration is made possible without the wire extrusion of the metal wiring in the memory cell circuit of 1-R/W; and in FIG. 10, the memory cell circuit of a two bit configuration is presented without the wire extrusion.

In contrast, 2 BCs are needed for a one bit configuration in the prior art. Furthermore, since the prior art shown in FIG. 20 has only a small number of MOS channels, a one bit configuration is difficult to construct.

Next, the embodiment of the present invention involving an efficient structuring of various logic circuits based on the basic cell shown in FIG. 1 will be explained through FIGS. 11 to 15.

Figure 11:
FIG. 11 is a two-input NAND circuit.
Figure 12:
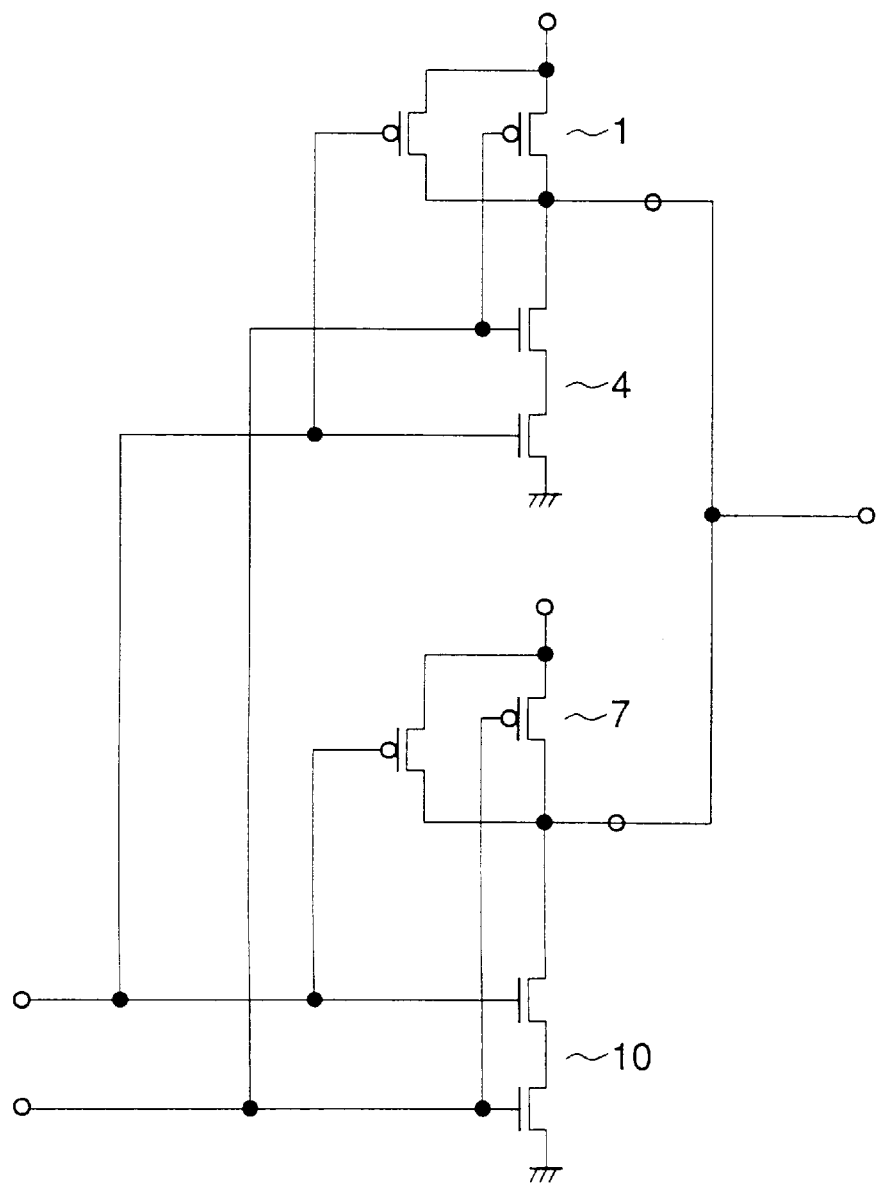
FIG. 12 is a detailed circuit diagram of a two-input NAND circuit.
Figure 13:
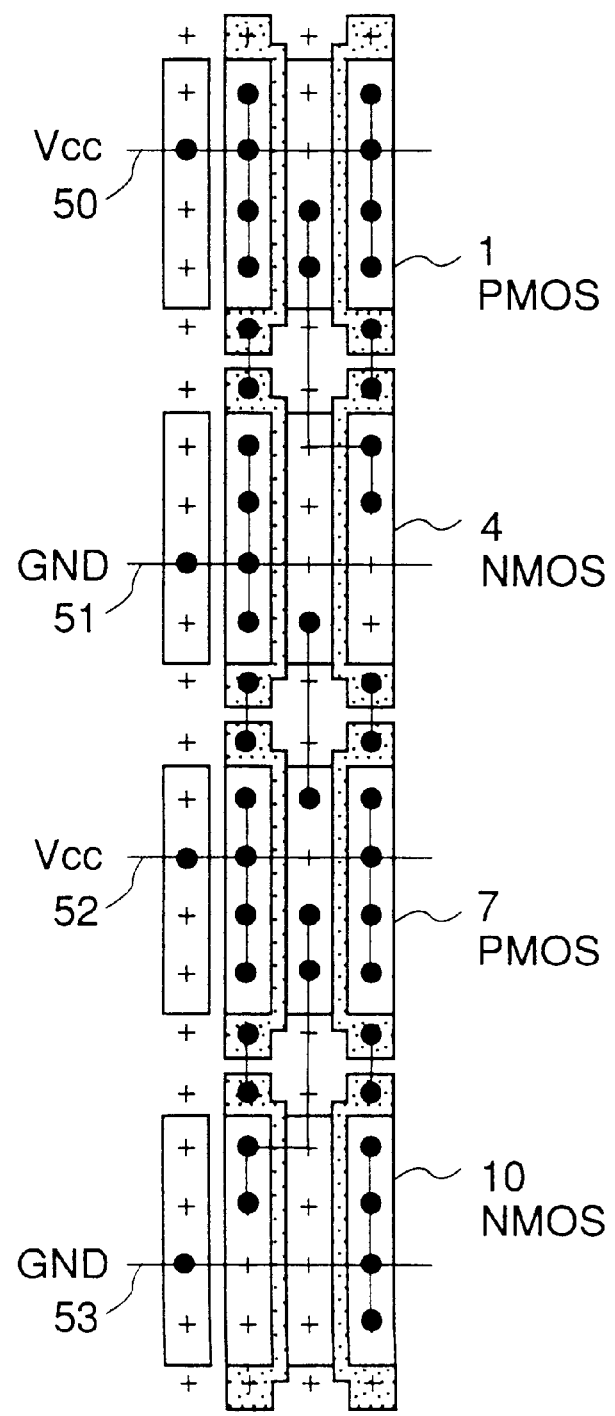
FIG. 13 shows a placement of a pair of two-input NAND circuit having basic cells.

FIG. 11 shows a 2-input NAND circuit, and FIG. 12 is an internal structure diagram of two 2-input NAND circuits connected in parallel. Furthermore, FIG. 13 shows a placement of the basic cell of FIG. 1 in the configuration of the two 2-input NAND circuits shown in FIG. 12.

In this embodiment of the present invention, one 2-input NAND circuit is composed of the two-PMOS unit 1 and the two-NMOS unit 4, in which the MOS has ½ the size of the MOS channel width W, which is necessary for obtaining the desired gate speed. Furthermore, a different 2-input NAND circuit is composed of the two-PMOS unit 7 and the two-NMOS unit 10, in which the MOS has ½ the size of the MOS channel width W, which is necessary for obtaining the desired gate speed. The inputs of these two different 2-input NAND circuits are connected together and the outputs of these two different 2-input NAND circuits are connected together to produce one 2-input NAND circuit in which the MOS has the necessary MOS channel width W size for obtaining the desired gate speed.

To structure a 2-input NAND circuit of these types, the metal wiring of the first layer, indicated by solid line, and the MOS devices are wired through the contact holes, indicated by round black dots, and the Vcc power lines 50 and 52 and the GND power lines 51 and 53 are wired in the X-direction.

In this way, in regard to the embodiment of the present invention, by providing the invention with two pairs of two PMOSs and two NMOSs, in which the MOS has ½ the size of the MOS channel width W, and by connecting in parallel the gate circuits, which are composed by a pair of PMOSs and NMOSs of ½ the size of the MOS channel width W necessary for obtaining the desired gate speed, and by yielding a signal through the wired channel, a gate circuit, more specifically, a 2-input NAND circuit constituted by one basic cell, having the desired gate speed and lacking the wire extrusion in the metal wiring can be constructed efficiently.

Furthermore, in this embodiment, since the connections to the input terminals of the gate electrodes of the NMOSs, which are directly connected, are reversed at the two 2-input NAND circuits, the dependency of the input terminals on the logic threshold voltage can be reduced.

Figure 14:
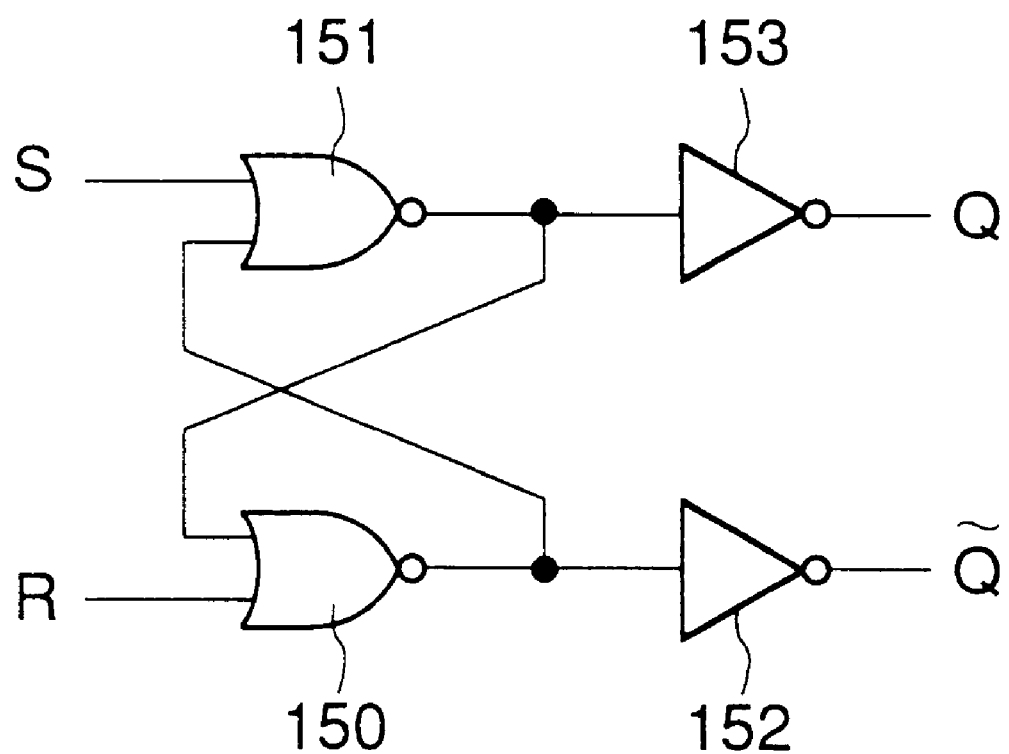
FIG. 14 is a R-S flip-flop circuit.

FIG. 14 shows an ordinary R-S flip-flop circuit. This flip-flop circuit is composed of the 2-input NOR circuits 150 and 151 and the inverter circuits 152 and 153. When the level of the set terminal S is "1," the level of the Q terminal becomes "1," and when the level of the reset terminal R is "1," the level of the Q terminal becomes "1 ."

Figure 15:
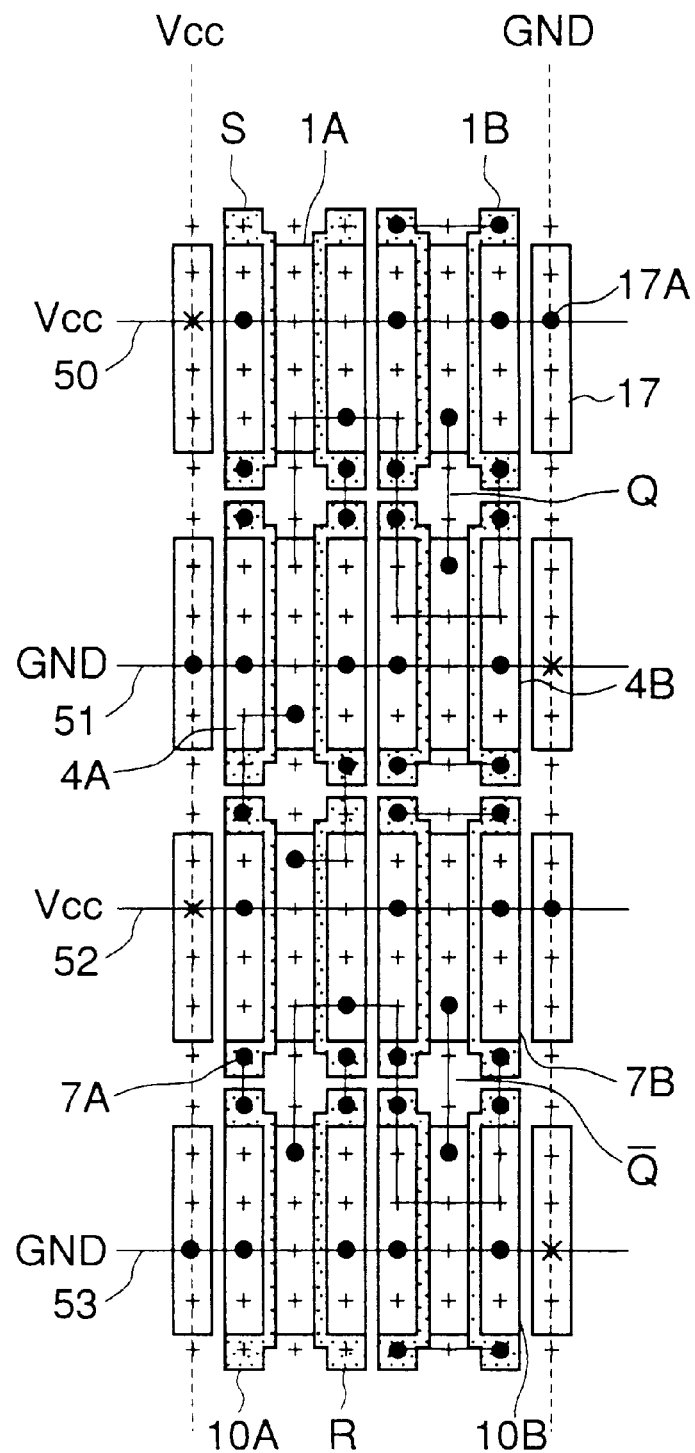
FIG. 15 shows a placement of a R-S flip flop circuit having basic cells.

FIG. 15 shows placements of the basic cell of FIG. 1 in the configuration of the R-S flip-flop circuit shown in FIG. 14. The R-S flip-flop circuit of the embodiment of the present invention is composed of two of the basic cell. That is, the two-PMOS unit 1A and the two-NMOS unit 4A compose the 2-input NOR circuit 151; and the two-PMOS unit 7A and the two-NMOS unit 10A compose the 2-input NOR circuit 150. Additionally, the two-PMOS unit 7B and the two-NMOS unit 10B compose the inverter circuit 152. Concerning the connections of each device in the circuit, the metal wiring of the first layer, indicated by solid line, and the semiconductor MOS devices are connected through the contact holes 17A, and the metal wiring of the first layer and the metal wiring of the second layer, indicated by dashed line, are connected through the through holes. Moreover, the Vcc power lines 50 and 52 and the GND power lines 51 and 53 are wired along the X-direction.

The 2-input NOR circuit 150 and the 2-input NOR circuit 151 of the present embodiment are each made up of a pair of PMOSs and NMOSs in which the MOS has ½ the size of the MOS channel width W necessary for obtaining the desired gate speed, but these circuits are the internal circuits of the R-S flip-flop circuit, and since the load is very light, there is no appreciable degradation in speed compared with the increased size. On the contrary, the effect of the reduction of the fan out load becomes greater because the input capacity is ½.

On the other hand, since the inverter circuit 152 and the inverter circuit 153, which yields signal on the wiring channels, are each structured to have the MOS of the MOS channel width necessary for obtaining the desired gate speed, the R-S flip-flop circuit can obtain the desired circuit speed.

In this way, in regard to the embodiment of the present invention, since there is provided two pairs of two PMOSs and two NMOSs in which the MOS has ½ the size of the MOS channel width W, which is necessary for obtaining the desired gate speed, the gate circuits, which are composed by a pair of PMOSs and NMOSs of ½ the size of the MOS channel width W necessary for obtaining the desired gate speed, are made to connect together and are made to output through the wired channel. Furthermore, the internal circuit is made to have a small input capacity by the configuration of a pair of PMOSs and NMOSs which have ½ the size of the MOS channel width W necessary for obtaining the desired gate speed with the standard load. Therefore, a complicated gate circuit having the desired circuit speed, for instance, the R-S flip-flop circuit created by two basic cells, can be efficiently constructed without the wire extrusion in the metal wiring of the first and second layers.

In contrast, in the prior art, which does not have a pair of PMOSs and NMOSs with ½ the size of the MOS channel width W necessary for obtaining the desired gate speed with the standard load, three BCs would be necessary in the R-S flip-flop circuit of the prior art configuration, for example, and the input volume would be also large. Furthermore, in the prior art shown in FIG. 20, since the MOS channel number is few, it would be difficult to construct a complicated macro-cell without the wire extrusion of the metal wiring of the first and second layers.

Next, appropriate heights of the basic cell will be explained through the plots of FIGS. 16 and 17.

Figure 16:
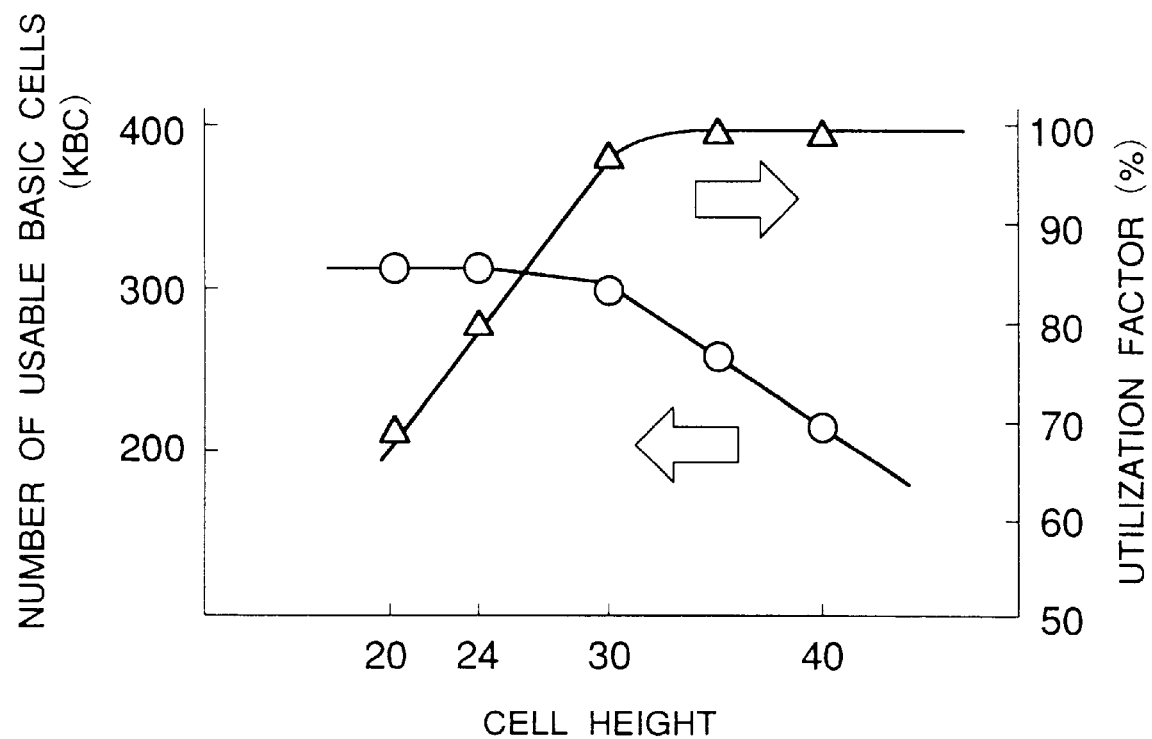
FIG. 16 is a plot showing the relationships of the basic cell height to the number of usable basic cells and to the utilization factor.

FIG. 16 shows a result of trial and error determination of wire extrusion in the macro-cell configuration, based on experiences in the theory and DA (Design Automation) of the utilization factor and the number of usable basic cells when the basic cell height is varied.

In this instance, as the basic cell increases in size, the wiring channels around the basic cell increase, and the utilization factor rises. On the other hand, the number of usable basic cells remains approximately constant until the utilization factor reaches 100% because the utilization factor increases even though the number of raw basic cells decreases as the basic cells are made larger. However, after the utilization factor reaches 100%, if the basic cells are made still larger, the number of usable basic cells decreases as the basic cell size is increased. Furthermore, as the basic cell height is increased to about 30 in pitch, the number of basic cells that can be placed on the LSI chip decreases, but the essential number, the number of usable basic cells remains constant. However, since the wire extrusion in the construction of macro-cell occurs when the height of the basic cell is at 20 in pitch, compared with the case of 24 in pitch, the number of usable basic cells is less.

Figure 17:
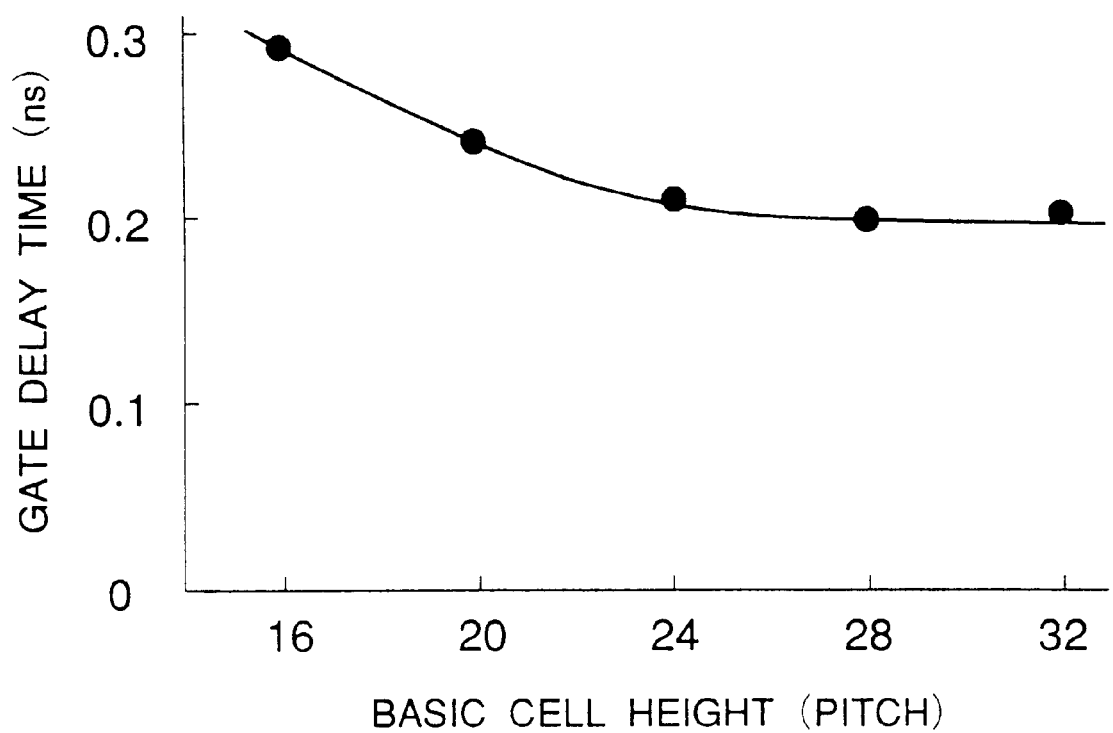
FIG. 17 is a plot showing the relationship of the basic cell height to the gate delay time.

FIG. 17 shows the calculated values of the gate time delay in reference to the standard load of the 2-input NAND gate when the height of the basic cell shown in FIG. 1 is varied.

As it is apparent from FIG. 17, the increase in speed is small even if the basic cell height is made greater than 24 in pitch. In the structures of various different logic circuits, 20 in pitch at the smallest is adequate, but from the results of examinations, that is, by considering the efficiency of the circuits, the number of usable basic cells, the gate speed, and the ease in which the memory cell circuits or the logic circuits can be built, the desired basic cell height is determined to be 24 to 30 in pitch.

In this way, in regard to this embodiment, the memory density can be raised, and the gate circuit, or more specifically, the 2-input NAND circuit constituted by one basic cell, having the desired gate speed and lacking the wire extrusion of the metal wiring of the second layer can be efficiently constructed. Additionally, a complicated gate circuit having the desired circuit speed, or more specifically, the R-S flip-flop circuit comprising two basic cells, can be constructed efficiently with a small input capacity and without the wire extrusion of the metal wiring. Furthermore, the wiring pitch in the X-direction can be made to be a pitch of ¼ the height of the basic cell.

For each embodiment discussed thus far, concerning the distribution of the basic cells in the Y-direction, the order of NMOS-PMOS-NMOS-PMOS is also possible besides the order of PMOS-NMOS-PMOS-NMOS, and the order of PMOS-NMOS-NMOS-PMOS is also possible. Furthermore, the order of NMOS-PMOS-PMOS-NMOS is possible.

Concerning the construction of the basic cell, the gate electrodes 1 and 3 and gate electrodes 5 and 6 are each separated, and furthermore, gate electrodes 8 and 9 and gate electrodes 11 and 12 are each separated in the embodiments of the present invention, but each gate electrode can also be connected to each other.

Next, another embodiment of the present invention will be explained through FIGS. 18 and 19.

The embodiment of the present invention relates to a 2-input NAND of BiCMOS with the bipolar transistor 200 added to the basic cell of FIG. 1.

Figure 18:
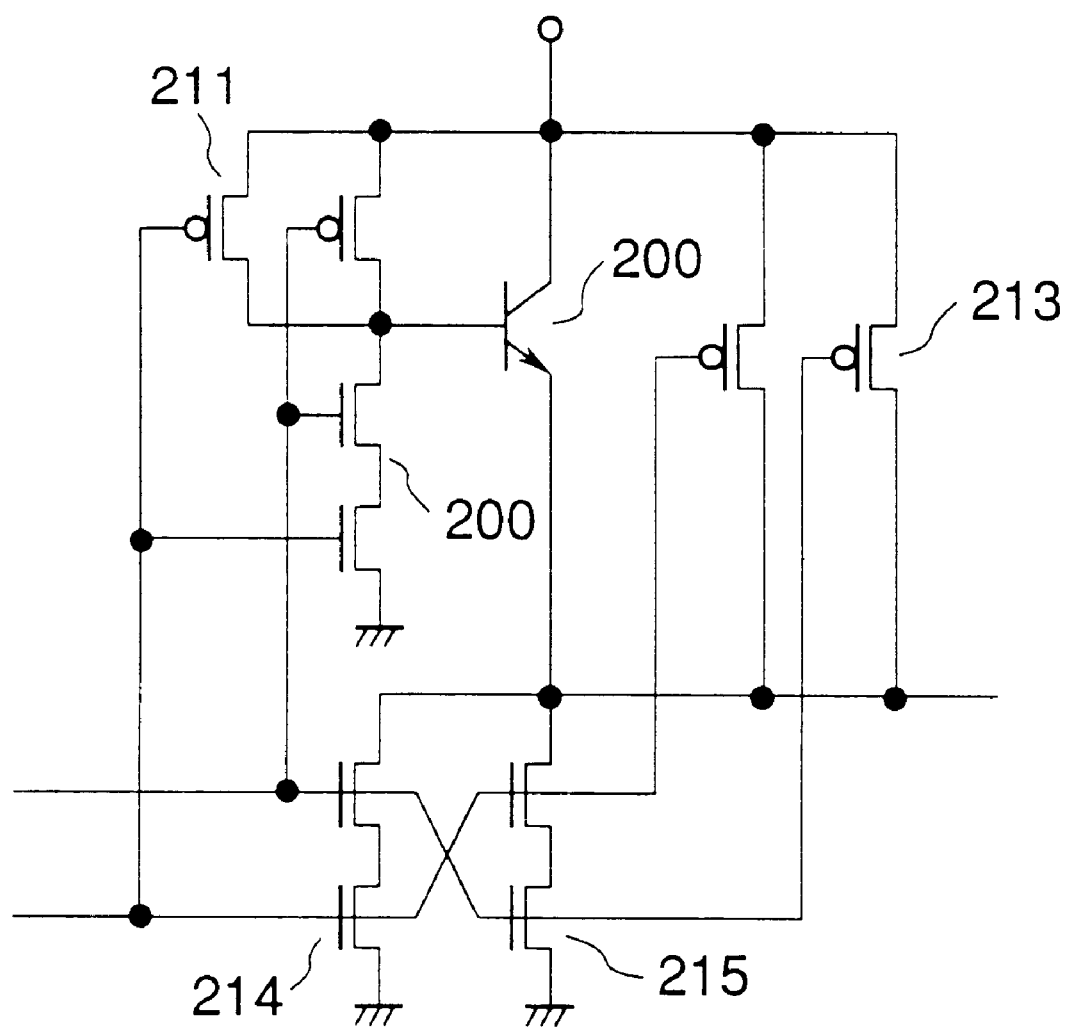
FIG. 18 is a two-input NAND circuit of BiCMOS.

The NAND circuit shown in FIG. 18 comprises a pair of the PMOSs 211, a pair of the NMOSs 210, a pair of the NMOSs 214, a pair of the NMOSs 215, a pair of the PMOSs 213, and the bipolar transistor 200. Each PMOS 211 is used for the operation of the bipolar transistor 200, and the two NMOSs 210 are used as a means for charge extraction of the bipolar transistor 200. Each of the two NMOSs 214 and the two NMOSs 215 comprises an output level, and the gate electrodes are mutually inter-connected to the input terminals. This is done to reduce the dependency of the input terminals on the logic threshold voltage. On the other hand, the two PMOSs 213 are provided to pull the high level output up completely to the electrical potential of the power source. Furthermore, in order to shorten the output ramp-down time, the two NMOSs 214 and the two NMOSs 215 are connected together in parallel.

Figure 19:
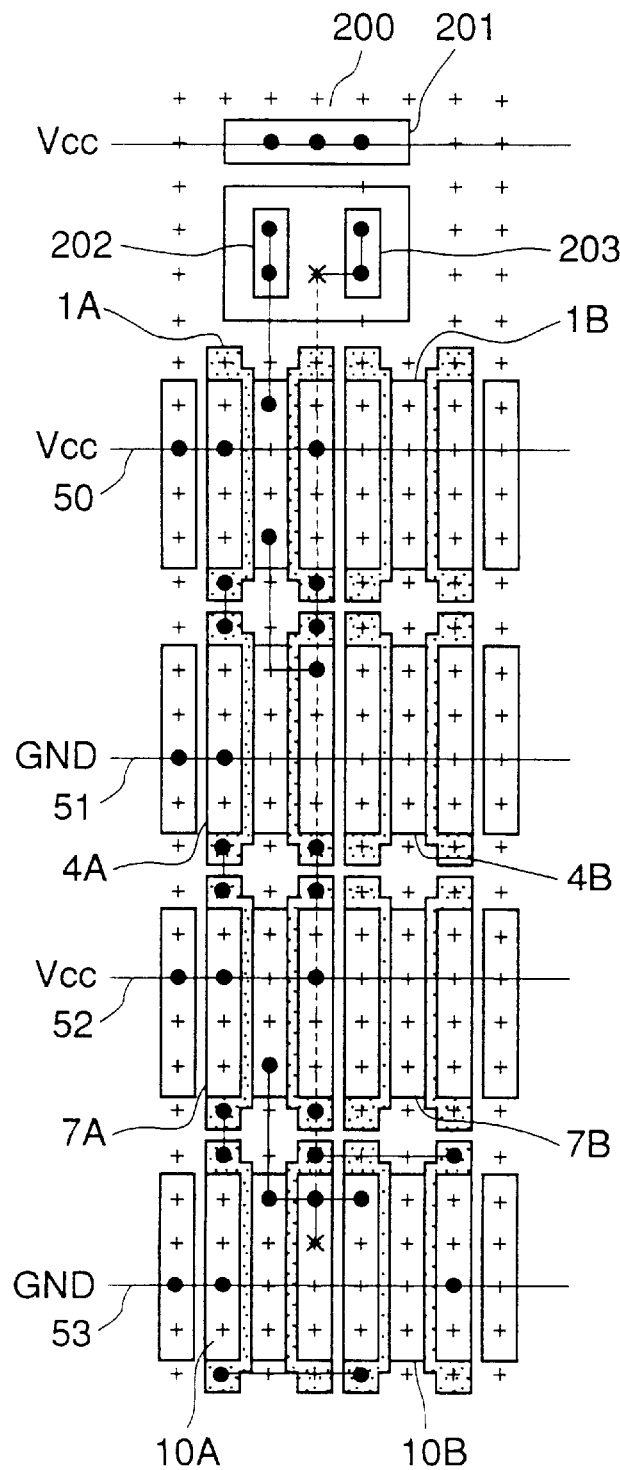
FIG. 19 shows a placement of a BiCMOS two-input NAND circuit having basic cells.

FIG. 19 shows a placement of the 2-input NAND of FIG. 18. With respect to FIG. 19, the bipolar transistor 200 comprises the collector domain 201, the base domain 202, and the emitter domain 203. The two-PMOS unit 1A constitutes the pair of the PMOSs 211; and the two-NMOS unit 4A constitutes the pair of the NMOSs 210. Additionally, the two-PMOS unit 7A constitutes the pair of the PMOSs 213; and the two-NMOS unit 10A constitutes the pair of the NMOSs 214. Furthermore, the two-NMOS unit 10B constitutes the pair of the NMOSs 215. For configuring each semiconductor device, the metal wiring of the first layer, indicated by solid line, and the MOS and bipolar devices are connected through the contact holes (round black dots), and the metal wiring of the first layer and the metal wiring of the second layer, indicated by dashed line, are connected through the through holes (marked by "X").

Furthermore, the Vcc power lines 50 and 52 are wired in the X-direction, and the GND power lines 51 and 53 are wired in the X-direction. Additionally, either the substrate or the diffusion layer domain of the fixed electrical potential well is fixed at a predetermined electrical potential through the contact holes.

Additionally, in the embodiment of the present invention, the areas of the two-PMOS unit 1B, the two-NMOS unit 4B, the two-PMOS unit 7B are not used, but if the CMOS circuit is formed in this domain, waste is eliminated.

In this way, in accordance with the embodiment of the present invention, in the case of building a 2-input NAND of BiCMOS by the basic cells which include the MOS and the bipolar transistor, wiring can be performed without the wire extrusion of the metal wiring.

Moreover, in the embodiment of the present invention, the size of the MOS transistors are all of the same size, but it is possible to change the size according to the need. For instance, the two-NMOS unit 4A can be made small and the two-NMOS unit 10A can be enlarged.

In addition, in the under side of the Y-direction of the two of the NMOS 10A, it is possible to add two NMOSs. In this instance, the NMOSs that constitute the output level of the BiCMOS gate can be formed by the two-NMOS unit 10A and the two NMOSs that are placed below the two-NMOS unit 10A. If configured this way, the CMOS circuit of the ordinary size can be configured with the left-over CMOSs.

In regard to the present invention, since the contact holes placed on both sides of the power line as contact holes within the MOS channel width and the contact hole adjoining on one side of the power line, besides the contact holes connected to the power line of the signal line width, are formed in the direction perpendicular to the power line, the wire extrusion can be avoided and the utilization factor can be raised in the case of constructing a circuit. Furthermore, since the basic cell is constituted by two pairs of two-PMOS units and two pairs of two-NMOS units (four units in total), and since each pair of the basic cells is connected in parallel, the speed-up of the gate speed and increase in the memory density are obtained, with the result of obtaining a highly efficient basic cell.

Figure 25:
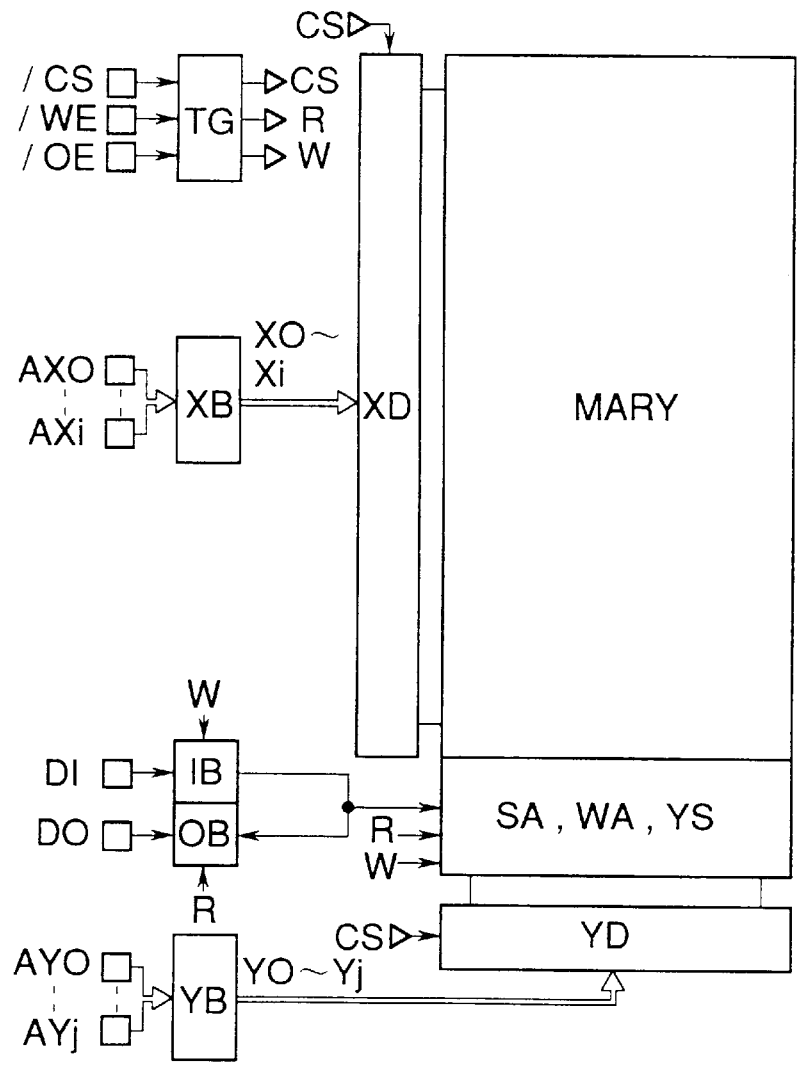
FIG. 25 shows a block diagram of one embodiment of the present invention relating to a static type RAM.

FIG. 25 shows one embodiment of the present invention relating to a static type RAM. The circuit devices that constitute each block are not specially limited, as with the logic circuits not shown in the figure in accordance with the need, and are also formed on the semiconductor substrate of one single-crystal silicon produced by a well-known CMOS manufacturing technique.

The static type RAM of this embodiment has the memory array MARY that is placed on the greater part of the semiconductor substrate surface as a fundamental composition element. This memory array MARY, as will be explained further later, includes a plurality of word lines extended in the horizontal direction in the figure and a plurality of complementary data lines extended in the vertical direction in the figure. At each cross point of the word lines and the complementary data lines, a static type memory cell is placed in a lattice-like fashion.

The plurality of word lines that are included in the memory array MARY is connected on the left side to the X address decoder XD and is in a single select mode. With a plurality of memory cells connected to the output part of this X address decoder XD, a word line driving circuit that accelerates the drive of the word lines is attached to these lines designed to hold a large capacity of load. The X address decoder XD is supplied with the internal address signals X0 to Xi of i+1 bit from the X address buffer XB and the internal control signal CS from the dynamic generating circuit TG. Additionally, the X address buffer XB is supplied with the X address signals AX0 to AXi through the outside terminals AX0 to AXi.

The X address buffer XB calls and stores the X address signals AX0 to AXi through the outside terminals AX0 to AXi and forms the internal address signals X0 to Xi from the X address signals and supplies these signals to the X address decoder XD. The X address decoder XD switches into the operation mode selectively by receiving the high level signal of the internal control signal CS and decodes the internal address signals X0 to Xi and selects one of the word lines formed in the memory array MARY to be in the selective mode of the high level like the power voltage Vcc. The unselected level of the word lines is in the low level, that is, the ground potential Vss.

The Y switch YS, sense amp SA, and write amp WA are formed on the bottom side of the plurality of the complementary data lines that are included in the memory array MARY. The Y switch YS includes the Y switch for write-in and the Y switch for read-out. The Y switch for write-in is connected to the write amp WA, and the Y switch for read-out is connected to the output of the sense amp SA, which is connected to the input of the one side of the data line, within the complementary data lines, for read-out.

The Y address decoder YD is supplied with the internal address signals Y0 to Yj of j+1 bit from the Y address buffer YB and is supplied with the internal control signal CS from the dynamic generating circuit TG. The Y address buffer B is supplied with the Y address signals AY0 to AYj through the outside terminals AY0 to AYj.

The Y address buffer YB calls and stores the Y address signals AY0 to AYj through the outside terminals AY0 to AYj and forms the internal address signals Y0 to Yj from the Y address signals and supplies these signals to the Y address decoder YD. The Y address decoder YD switches into the operation mode selectively by receiving the high level signal of the internal control signal CS and decodes the internal address signals Y0 to Yj and forms the Y selective signals.

The input of the aforementioned write amp WA is attached to the output terminal of the data input buffer IB, and the input terminal of this data input buffer IB is attached to the data input terminal DI. In addition, the output signal of the sense amp SA is connected to the input terminal of the data output buffer OB, and the output terminal of this data output buffer OB is attached to the data output terminal DO. The data input buffer IB is set in the operation mode by the control signal W during the write-in operation.

The data input buffer IB is set in the operation mode when the static type RAM is set in the write-in mode by the control signal W, and then the data input buffer IB calls and stores the write-in data supplied through the data input terminal DI and supplies to the input of the write amp WA. At this instance, the selective signal formed by the Y address decoder YD and the output signal of the write amp WA corresponding to the complementary data line selected by the control signal W, indicated above, are transmitted to the complementary data line and are written into a selected memory cell.

When the static type RAM is set in the read-out mode by the control signal R, the sense amp SA is initiated to amplify and yield the write-in signal of small oscillating amplitude that appeared on the data line with the activation of a signal that corresponds to the selected data line of the memory array MARY according to the selective signal formed by the Y address decoder YD. The data output buffer OB is set in the operation mode by the control signal R and amplifies the read-out signal that is amplified by the sense amp SA and sends the signal outside the static type RAM from the data output terminal DO.

With the chip select signal $\overline{CS}$, the write enable signal $\overline{WE}$, and the enable signal $\overline{OE}$, which are supplied from outside as initialization control signals, as bases, the timing generating circuit TB determines the operation mode and forms an internal control signal corresponding to each operation mode. The upper bar indicates the active level for the low level signal.

Figure 21:
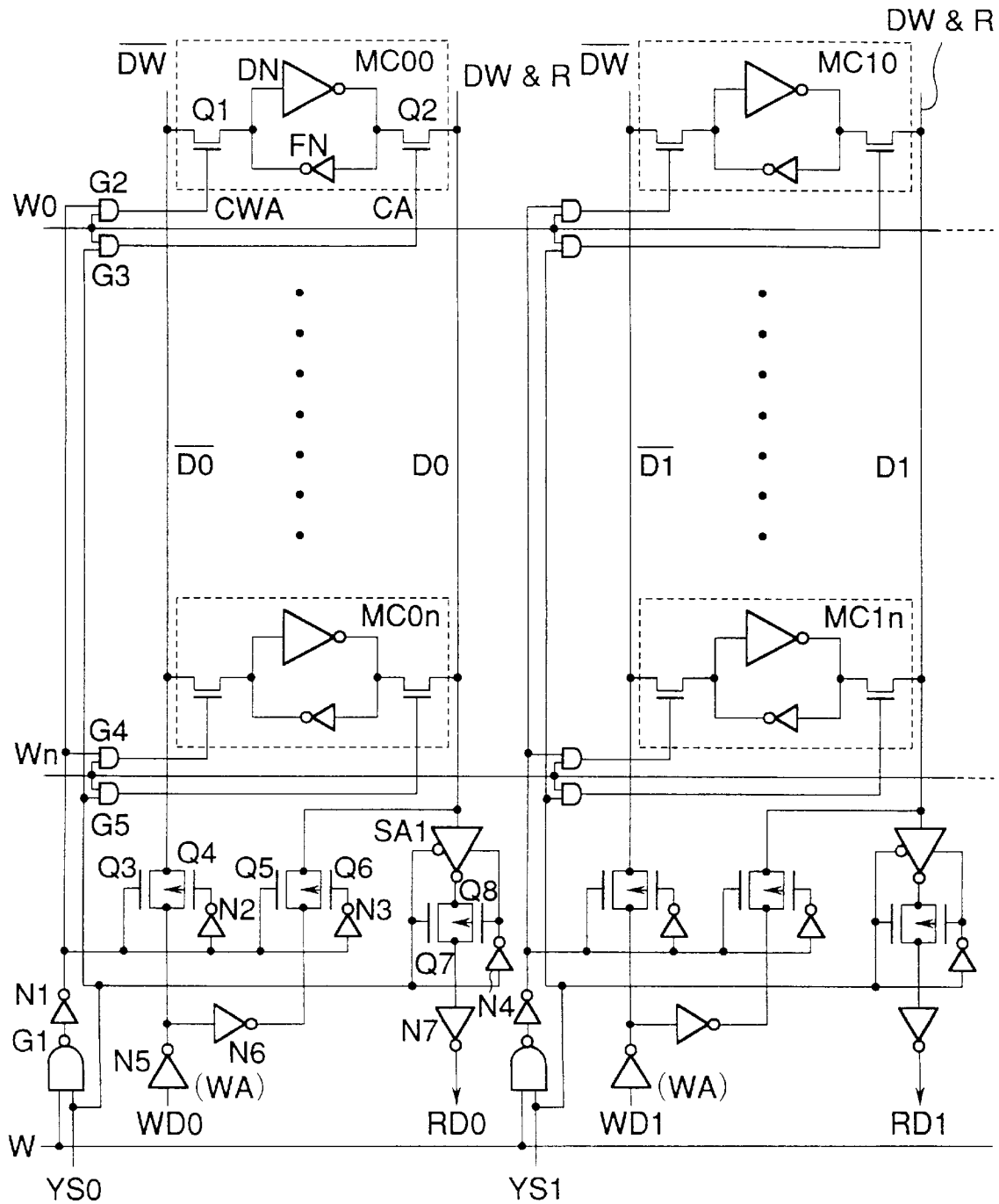
FIG. 21 shows an essential part of a circuit diagram of one embodiment of the present invention relating to a static type RAM.

FIG. 21 shows an embodiment of the present invention relating to an essential circuit diagram of the static type RAM. Two pairs of the complementary data lines D0 and $\overline{D0}$, and D1 and $\overline{D1}$, four memory cells corresponding to two lines of the word lines W0 and Wn, the column switch, the sense amp, and the write amp are shown in the same figure as representative examples.

The memory cell MC00 includes the transfer MOSFETs Q1 and Q2, which are situated in between a latch circuit that has the outputs and the inputs of the feed-back inverter circuit FN and the drive inverter circuit DN inter-connected, the pair of the output nodes having complementary relationships with this latch circuit, and the complementary data lines D0 and $\overline{D0}$. The memory cell MC00 receives the write-in signal of complementary relationship supplied from the complementary data lines D0 and $\overline{D0}$ during the write-in operation and, during the read-out operation, transmits the read-out signal from the data line D0 of one side corresponding to the output of the driving inverter circuit DN. For this reason, because the data line $\overline{D0}$ is only used for write-in, it is shown as the data line $\overline{DW}$, and because the data line D0 is used for both write-in and read-out, it is shown as the data line W&R.

The transfer MOSFETs Q1 and Q2, unlike those in the prior art, are not connected commonly; and by the selective signals CWA and CA supplied to the MOSFETs Q1 and Q2 through the AND gate circuits G1 and G3, both MOSFETs Q1 and Q2 are turned on during the write-in operation and only MOSFET Q2 is turned on during the read-out operation. The structures are the same for the other memory cells MC0n, MC10, and MC1.

The signal transmitted through the inverter circuit N1 and the NAND gate circuit G1, which receives the write-in control signal W and the column selective signal YS0 corresponding to the selective signal of the word line D0 and the complementary data lines D0 and $\overline{D0}$, is supplied to the input of the AND gate G2 corresponding to the transfer MOSFET Q1 of the memory cell MC00. The same word line D0 and the column selective signal YS0 are supplied to the AND gate circuit G3 corresponding to the transfer MOSFET Q2.

In accordance with these, with the control signal W being the write-in operation made to be at the high level, when the word line W0 and the column selective signal YS0 are made to be at the high level, the output signal CWA of the AND gate circuit G2 is set to the high level by the high level of the output signal of the inverter circuit N1 and the high level of the word line W0, the transfer MOSFET Q1 is turned on, the output signal CA of the AND gate circuit G3 is set to the high level by the high level of the column selective signal YS0 and the high level of the word line W0, and the transfer MOSFET Q2 is turned on. As a result, both the transfer MOSFETs Q1 and Q2 of the memory cell MC00 selected during the write-in operation are turned on.

The control signal W is made to be in the low level during the read-out operation. For this reason, the output signal of the inverter circuit N1 is maintained at the low level regardless of the column selective signal YS0 being made to be at the high level. Even if the word line W0 is made to be at the high level, the output signal CWA of the AND gate circuit G2 is maintained at the low level, and the transfer MOSFET Q1 is turned off. The output signal CA of the AND gate circuit G3 is set to the high level by the high level of the column selective signal YS0 and the high level of the word line W0, and the transfer MOSFET Q2 is turned on. As a result, of the pair of the transfer MOSFETs Q1 and Q2 of the memory cell C00 selected during the read-out operation, only the transfer MOSFET Q2 corresponding to the data line D0 is turned on.

Concerning the other memory cell MC0 that is connected to the same complementary data lines D0 and $\overline{D0}$, since the word line Wn is made to be at the unselected low level, a pair of corresponding transfer MOSFETs is turned off. In the memory cell MC10, which is connected to the unselected complementary data lines D1 and $\overline{D1}$ and the word line W0 that is in the selected mode, the column selective signal YS1 is set to the low level of the unselected level, and in a similar manner as above, both of the transfer MOSFETs are turned off. For the memory cell MC1n, it is obvious that the transfer MOSFETs are turned off for the similar situation in the word lines and the selective signal.

To prevent the execution of write-in error by the left-over level in the data line D0 that is in the floating mode during the read-out operation, the memory cell MC00 is connected only to the input/output nodes of one side of the latch circuit that has a complementary relationship with an information storage part in the data line D0, which is one of the complementary data lines D0 and $\overline{D0}$; and in comparing the driving inverter circuit DN with the feed-back inverter circuit FN, the output impedance is made small. In other words, the size of the MOSFETs, which constitute the driving inverter circuit DN, is made large and the "on" impedance of the MOSFETs is made small.

In accordance with this, the output signal of the driving inverter circuit DN of the memory cell MC00 executes storing of information that induces the low level; and when the transfer MOSFET is turned on and the write-in operation is initiated, with the high level still remaining in the data line D0 because of, for example, the write-in cycle, the high level of the data line D0, is voltage divided by the "on" mode MOSFET being one of the plurality of MOSFETs (not shown) included in the driver inverter circuit DN and by the transfer MOSFET Q2, and this divided voltage is transmitted to the input of the feed-back inverter circuit FN. In this instance, since the "on" resistance of the prescribed MOSFET, which is included in the driving inverter circuit DN, is smaller in comparison with the "on" resistance of the transfer MOSFET Q2, the input signal, transmitted to the input of the feed-back inverter circuit FN, does not go over the logic threshold value of the feed-back inverter circuit FN, and thus write-in errors can be prevented.

For example, even if a value momentarily goes over the logic threshold value of the inverter circuit FN, the driving inverter circuit FN, which allows only a necessary small driving current to flow for information storage, draws the potential of the data line D0 to the low level in a comparative short time by the output signal of the driver inverter circuit DN and lowers the value to that below the logic threshold value of the inverter circuit FN during a comparatively long period of time necessary for drawing the input signal of the high level maintained in the large gate capacity of the driving circuit DN constituted from the large MOSFETs. For this reason, a pre-charge duration of the prior art is not necessary, and because read-out of the memory cell is executed rapidly, shortening of the memory cycle is accomplished.

For the write-in and read-out operation as described above, the column switch, the write amp WA, and the sense amp SA are each comprised as follows. The column switch of the write-in system has the CMOS switch, which is composed of the N-channel type MOSFET Q3, the P-channel type MOSFET Q4, the N-channel type MOSFET Q5, and the P-channel type MOSFET Q6. The gates of the N-channel type MOSFETs Q3 and Q5 are supplied with the output signal of the inverter circuit N1. The gates of the P-channel MOSFETs Q4 and Q6 are supplied with the output signal of the inverter circuit N1 through the inverter circuits N2 and N3. The inverter circuit N3 can be circumvented, and the output signal of the inverter circuit N2 can be supplied to the gates of the P-channel type MOSFETs Q4 and Q5; or the inverter circuits N2 and N3 can be circumvented, and the output signal of the NAND gate circuit G1, which is the output signal of the inverter circuit N1, can be directly supplied to the gates of the P-channel type MOSFETs Q4 and Q6.

The write amp WA comprises the inverter circuit N5 that transmits the write-in signal WD0 to the data line $\overline{D0}$ and the inverter circuit N6 that transmits the write-in signal to the data line D0, which receives the output signal of the inverter circuit N5. Similar to this embodiment, in the structure that has the write amp WA formed, which corresponds to the complementary data line, by being able to activate the column switch as a clocked inverter circuit by the selective signal, the column switch and the write amp can be commonly used.

The data line D0 that transmits the read-out signal is connected to the input of the sense amp SA1. This sense amp SA1 is activated by the column selective signal YS0. This amp also is activated during the write-in operation and yields the write-in signal. By this, the monitor signal that is for the confirmation of write-in can be yielded. If this output operation is unnecessary, it is also possible to activate the sense amp SA1 only during the read-out operation by supplying the read-out control signal R and the column selective signal YS0 and having equivalent circuits to the NAND gate circuit G1 and the inverter circuit N1.

The column switch for read-out is constituted by the CMOS switch composed of the N-channel type MOSFET Q7 and the P-channel type MOSFET Q8; and the gate of the N-channel type MOSFET Q7 is supplied with the column selective signal YS0; the gate of the P-channel type MOSFET Q8 is supplied with the column selective signal YS0 that is switched by the inverter circuit N4. The column switch Q7 and Q8 can be circumvented like in the case when the high impedance condition is achieved during the sense amp SA1, like the clocked inverter circuit, is in the unselected mode.

The write-in signals WD0 and WD1 and the read-out signals RD0 and RD1 made to correspond to each complementary data line are not particularly limited but are connected to the data input buffer IB and the data output buffer OB through the write-in common data line and the read-out common data line. To execute a memory access in units of several bits, the complementary data lines are separated in several groups, and the complementary data lines of several groups are simultaneously selected in pairs, and each pair is enabled for write-in/read-out.

Figure 22:
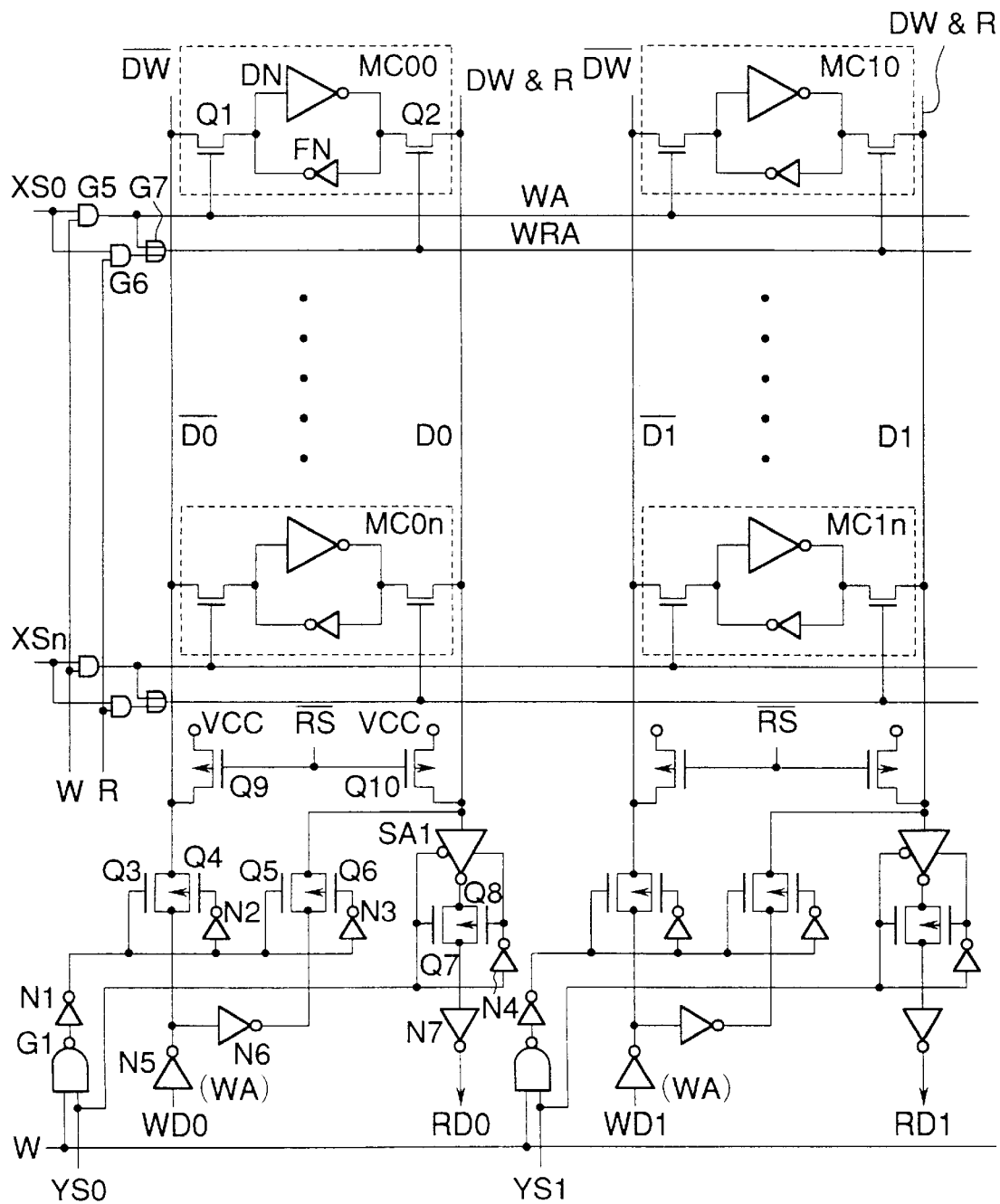
FIG. 22 shows an essential part of a circuit diagram of another embodiment of the present invention relating to a static type RAM.

FIG. 22 shows another embodiment of the present invention relating to an essential circuit diagram of a static type RAM. In the same FIG., two pairs of the complementary data lines D0 and $\overline{D0}$, and D1 and $\overline{D1}$, included in the memory array, as same as in FIG. 1, the four memory cells that are made to correspond to two lines of word lines, the column switch, the sense amp, and the write amp are shown as representative examples.

In this embodiment, the gates of the transfer MOSFETs, which are connected to the same word lines, are commonly connected. That is, of the memory cell MC00 formed in the complementary data lines D0 and $\overline{D0}$ and the transfer MOSFET of the memory cell MC10 formed in the complementary data lines D1 and $\overline{D1}$, that which is made to correspond to the data lines D0 and $\overline{D1}$ is connected to the word line WA, and that which is made to correspond to the data lines $\overline{D0}$ and D1 is connected to the word line WRA.

The word line WA is driven by the AND gate circuit G5, which receives the word line selective signal SX0 and the write-in control signal W; and the word line WA is driven by the OR gate circuit G7, which receives the word line selective signal XS0, the output signal of the AND gate circuit G6 that receives the read-out control signal R, and the output signal of the gate circuit G5. The pairs of word lines that are shown as the other representatives are also driven by the same circuit as above.

During the write-in operation that makes the control signal W to be at the high level, when the word line selective signal XS0 is made to be at the high level, the AND gate circuit G5 is raised to the high level and the word line WA is made to be at the selective level. The OR gate circuit G7 is also raised to the height level according to the selective level of the word line WA, and the word line WRA is also put into the selective level. By these, during the write-in operation, the word lines WA and WRA are simultaneously placed at the high level, and each pair of the transfer MOSFETs Q1 and Q2 of the memory cells MC00 and MC10 is turned on.

During the read-out operation, the control signal R is made to be at the high level; and since the word line selective signal XS0 is made to be at the high level, the output of the AND gate circuit is made to be at the high level and the word line WRA through the OR gate circuit G7 is made to be at the selective level of the high level. At this point, by the low level of the write-in control signal W, the output signal of the AND gate circuit G5 is made to be at the low level, and the word line WA is made to be at the unselected level of the low level. For this reason, the transfer MOSFETs Q1 of the memory cells MC00 and MC10 are turned off, and the transfer MOSFETs Q2 of the memory cells MC00 and MC10 are turned on.

As described in this embodiment, when a pair of word lines are commonly connected to a plurality of memory cells, one aspect is that the selective circuit of memory cells can be simplified, however, there is a fear of generating write-in errors by the left-over signal in the unselected data lines in consideration of the memory cells with the unselected data lines. In order to prevent such write-in errors, the reset MOSFETs such as Q9 and Q10 are included in the complementary data lines such as D0 and $\overline{D0}$. In the gates of these reset MOSFETs such as Q9 and Q10, the reset signal $\overline{RS}$ is supplied, and the complementary data lines such as D0 and $\overline{D0}$ are reset to the high level like the power voltage Vcc. This reset signal $\overline{RS}$ utilizes the write-in control signal W and is momentarily made to be at the low level at the initial rise of the write-in start time of the signal W. The other structures are the same as in FIG. 21, and their explanation shall be omitted.

Figure 23A:
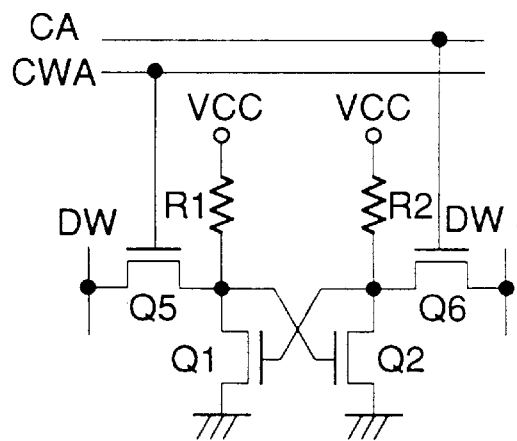
FIGS. 23A and 23B show circuit diagrams of one embodiment of a memory cell of a static type RAM of the present invention.
Figure 23B:
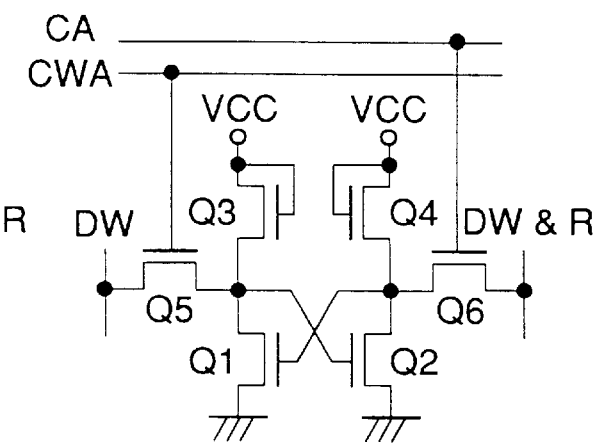

FIGS. 23A and 23B show an embodiment of the present invention relating to circuit diagrams of a memory cell. Concerning the explanation that follows below, in order to prevent the complication of the circuit diagram, the circuit symbols labeling the circuit devices such as MOSFETs overlap with those in FIGS. 21 and 22, but it must be understood that the each symbol used in FIGS. 23A and 23B refer to a separate circuit function.

FIG. 23A shows a circuit which comprises the driving MOSFETs of N-channel type Q1 and Q2 and the inverter circuit that has the load resistances R1 and R2, which are attached to the drains of Q1 and Q2. The inputs and the outputs of two of these inverter circuits cross-connected constitutes the latch circuit. The transfer MOSFETs Q5 and Q6 are respectively placed in between the drains of the MOSFETs Q1 and Q2, which are the pair of the output nodes that have complementary relationships, and the complementary data lines DW and DW&R. In the case of incorporating this circuit into the circuit in FIG. 21, the gate of the MOSFET Q5 is supplied with the same selective signal CWA, and the gate of the MOSFET Q6 is supplied with the same selective signal CA.

The data line DW&R has the read-out signal from the memory cells transmitted; the MOSFET Q2 that has the output node of the data line DW&R connected thereto constitutes the driver inverter circuit DN; and in comparison with the MOSFET Q1 which constitutes the feed-back inverter circuit FN, the MOSFET Q2 is made larger, and therefore, has a small "on" resistance. Also, the value of the resistance R2 attached to the Q2 drain is made small in comparison with the value of the resistance R1 of the other MOSFET. By this, the MOSFET Q2 and the output impedance of the inverter circuit, which corresponds to the resistance R2, are made small, and it is made not to receive the influence of the residual signal level in the data line DW&R during the read-out operation.

FIG. 23B shows a circuit which includes the N-channel type MOSFETs Q3 and Q4, replacing the resistances R1 and R2. In order to use these MOSFETs Q3 and Q4 as resistance devices, their gates are supplied constantly with the power voltage Vcc. In this way, the MOSFETs Q3 and Q4 operate as resistance devices. The other structures are the same as in FIG. 23A.

Figure 24A:
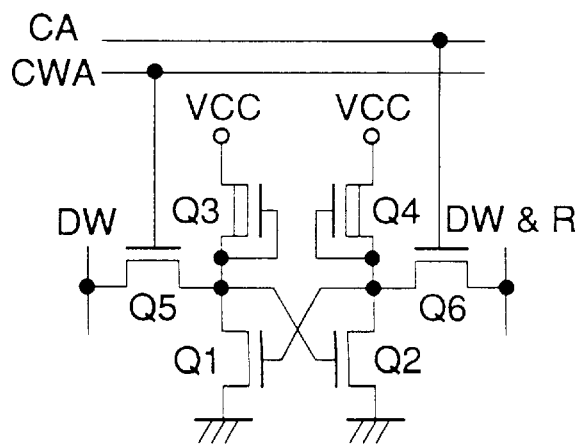
FIGS. 24A and 24B show circuit diagrams of another embodiment of a memory cell of a static type RAM of the present invention.
Figure 24B:
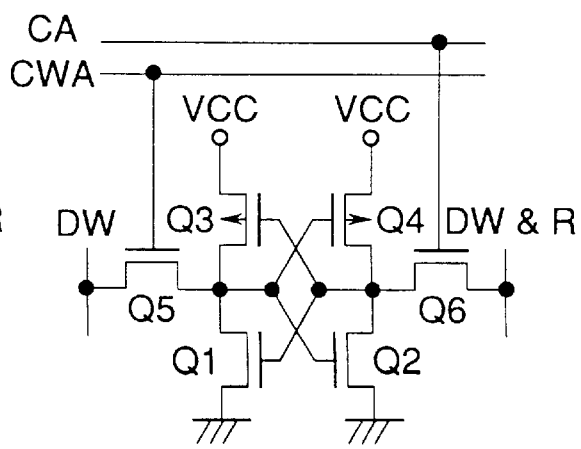

FIGS. 24A and 24B show another embodiment of the present invention relating to circuit diagrams of a memory cell. In the circuit in FIG. 24A, the MOSFETs Q3 and Q4, which are used as resistance devices, are of the depletion type. These MOSFETs Q3 and Q4, by having each gate and source connected together, conduct the constant current operation. That is, the inverter circuit in the memory cell of this embodiment holds the constant current source as a load. Accordingly, the load MOSFETs of the inverter circuit operate as a constant current source, and the other structures are the same as the memory cells of FIGS. 23A and 23B.

FIG. 24B shows a circuit in which the inverter circuit is a CMOS inverter circuit having the N-channel type MOSFETs Q1 and Q2 and the P-channel type MOSFETs Q3 and Q4. That is, the MOSFETs, Q1 and Q2, and Q2 and Q4, are directly connected, respectively, and correspondingly their gates are mutually made common. By cross connecting the inputs and the outputs of the inverter circuits in a similar manner as before, a latch circuit is made; the other structures are the same as those in FIGS. 23A and 23B. Additionally, in FIG. 9, an embodiment of another memory cell is given.

Figure 26:
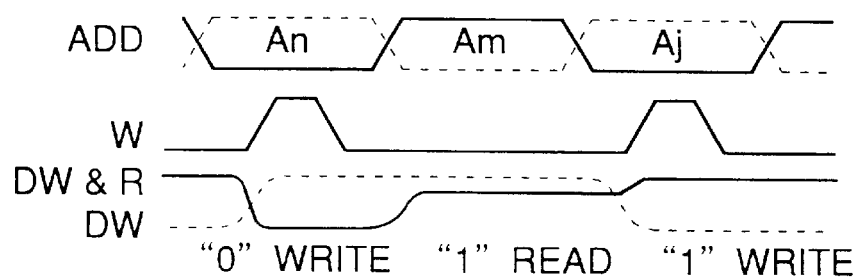
FIG. 26 is a waveform chart which explains one example of the operation of a static type RAM shown in FIG. 21.

FIG. 26 shows a waveform diagram that explains an example of the operation of the present invention. In the same figure, an example is given that executes "0" write, "1" read, and "1" write in the memory cell, which is attached to the addresses An, Am, and Aj, connected to the same complementary data lines.

When executing "0" write in the address An, the memory cell corresponding to the address An is selected; and when the write-in control signal W is made to be in the high level, the data line $\overline{DW}$ is made high and the data line DW&R is made low. Then, when the address is switched to Am, the low level of the data line DW&R from the previous cycle is made to be in the high level by responding to the stored value "1" in Am. At this point, the data line DW, used only during the write-in operation, is left at the high level, and because the transfer MOSFET corresponding to the data line DW is in the "off" mode, the memory cell is not made to switch. Therefore, when the output impedance of the driver inverter circuit is made small, an unbalance created by this output impedance and the output impedance of the feedback inverter circuit further prevents write-in errors.

When executing "1" write in the address Aj, the memory cell corresponding to the address Aj is selected; and when the write-in control signal W is made to be in the high level, the data line $\overline{DW}$ is maintained in the low level, and the data line DW&R is maintained in the high level; and the data line DW, responding to the write-in signal, is switched to the low level. Accordingly, in the memory cell, write-in of "1" is executed rapidly and, moreover, accurately.

Figure 27:
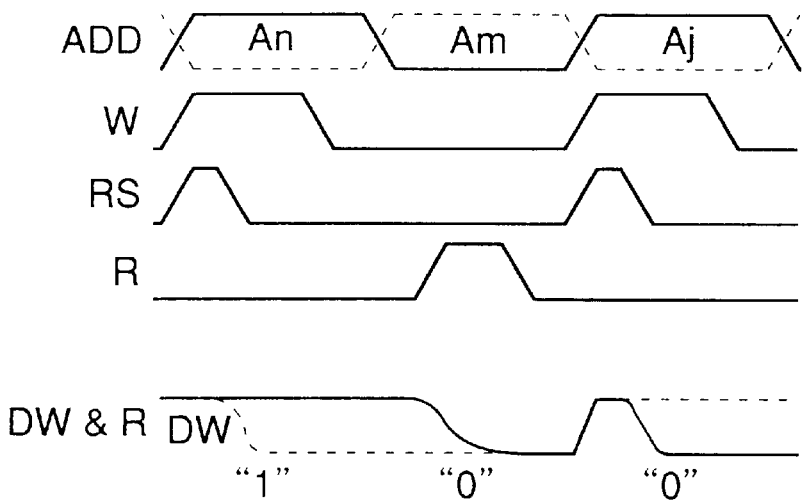
FIG. 27 is a waveform chart which explains one example of the operation of a static type RAM shown in FIG. 22.

FIG. 27 shows a waveform diagram that explains another example of the operation of the present invention. In the same figure, an example is given that executes "1" write, "0" read, and "0" write in the memory cell, which is attached to the addresses An, Am, and Aj, connected to the same complementary data lines.

When executing "1" write in the address An, the memory cell corresponding to the address An is selected; and when the write-in control signal W is made to be in the high level, the data line $\overline{DW}$ attempts to change to the low level and the data line DW&R attempts to change to the high level, but because the reset signal RS is changed to the high level at the point the control signal W is raised to the high level, the reset MOSFET is turned on by the low level of the switching signal $\overline{RS}$, and the data lines $\overline{DW}$ and DW&R are both changed to the high level. The above signal RS is produced, for example, by sending the control signal W and the switched delayed signal of the signal W to the logic integrated circuit, such as the AND gate circuit.

When the reset signal RS is changed to the low level after the delay period passes, the data line $\overline{DW}$ becomes low in responding to the write-in signal, and the data line DW&R remains in the high level. By this, to the selected memory cell, "1" is written in. As before, a pair of word lines is made to be in the selective level, and concerning the unselected memory cell of the complementary data line that is unselected, because the complementary data lines are also reset to the high level during the reset time, write-in errors are not executed.

Additionally, when the address is switched to Am, the high level of the data line DW&R from the previous cycle is made to be in the low level by responding to the stored value "0" in Am. At this point, the data line $\overline{DW}$, used only during the write-in operation, is left at the low level, and because the transfer MOSFET corresponding to the data line DW is in the "off" mode, the memory cell is not made to switch. Therefore, as before, when the output impedance of the driver inverter circuit is made small, an unbalance created by this output impedance and the output impedance of the feed-back inverter circuit further prevents write-in errors.

When executing "0" write in the address Aj, the memory cell corresponding to the address Aj is selected; and when the write-in control signal W is made to be at the high level, the reset signal RS is generated, in a similar manner as before; and after the data lines $\overline{DW}$ and DW&R are both made to be at the high level, the data line DW&R is made low in response to the write-in signal, and the data line $\overline{DW}$ is maintained at the high level. By this, "0" write-in is executed rapidly and, moreover, accurately in the memory cell.

In this embodiment, since the reset operation of the complementary data lines is utilized within the time period of the write-in signal, the write-in operation itself does not suffer any delay. That is, the write-in operation supplies the complementary data lines with the complementary write-in signals, and because the write-in operation for the memory cell is executed rapidly, only a short write-in time is required for the memory cell. For this reason, the reset signal RS is generated by taking advantage of the rising edge of the signal W during the first half of the memory cycle; and it becomes possible to reserve a necessary time adequately for resetting the complementary data lines.

In contrast, during the read-out operation, the memory cell, which is constructed from MOSFETs of comparatively small size for the purpose of high integration, is read-out, but the amplitude of the signal that is yielded to the data line DW&R for read-out is small, and there is a need to amplify this signal by the sense amp SA; and thus, there is a need to reserve a comparatively long period of time for the amplification by the sense amp and for the read-out to the data line DW&R associated with the memory cell. Since the memory cycle is set in response to this type of read-out operation and since there is plenty of time to spare in the write-in operation, there is no detrimental influence in practice even if the reset time is inserted into the write-in operation time.

Figure 28:
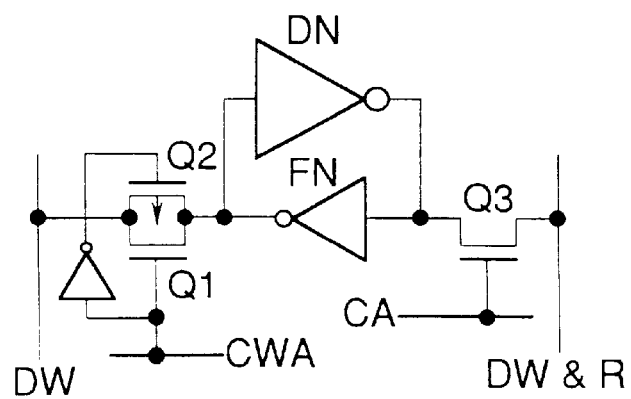
FIG. 28 shows a circuit diagram of another embodiment of the present invention relating to a memory cell of a static type RAM.

FIG. 28 shows an embodiment of the present invention relating to a circuit diagram of another memory cell in a static type RAM. In the embodiment shown in FIG. 28, the efficiency of the write-in operation is promoted, and to prevent write-in errors to the unselected memory cells during the read-out operation, the transfer gate, which is turned on only during the write-in operation, has a CMOS switch constituted by the N-channel type MOSFET Q1 and the P-channel type MOSFET Q2. To the gate of the P-channel type MOSFET Q2, the selective signal CWA that is inverted by an inverter circuit is supplied. The transfer gate corresponding to the data line DW&R that is used during the read-out operation is constituted by one N-channel type MOSFET.

By this structure, the "on" resistance of the transfer gate used as a route for read-out is comparatively large, and it does not receive the influence of the signal level of the data line DW&R. In contrast, the "on" resistance of the transfer gate associated with the data line DW is made small; and since the potential of the data line DW is transferred as is to the latch circuit, it is possible to execute the write-in operation efficiently.

Figure 29:
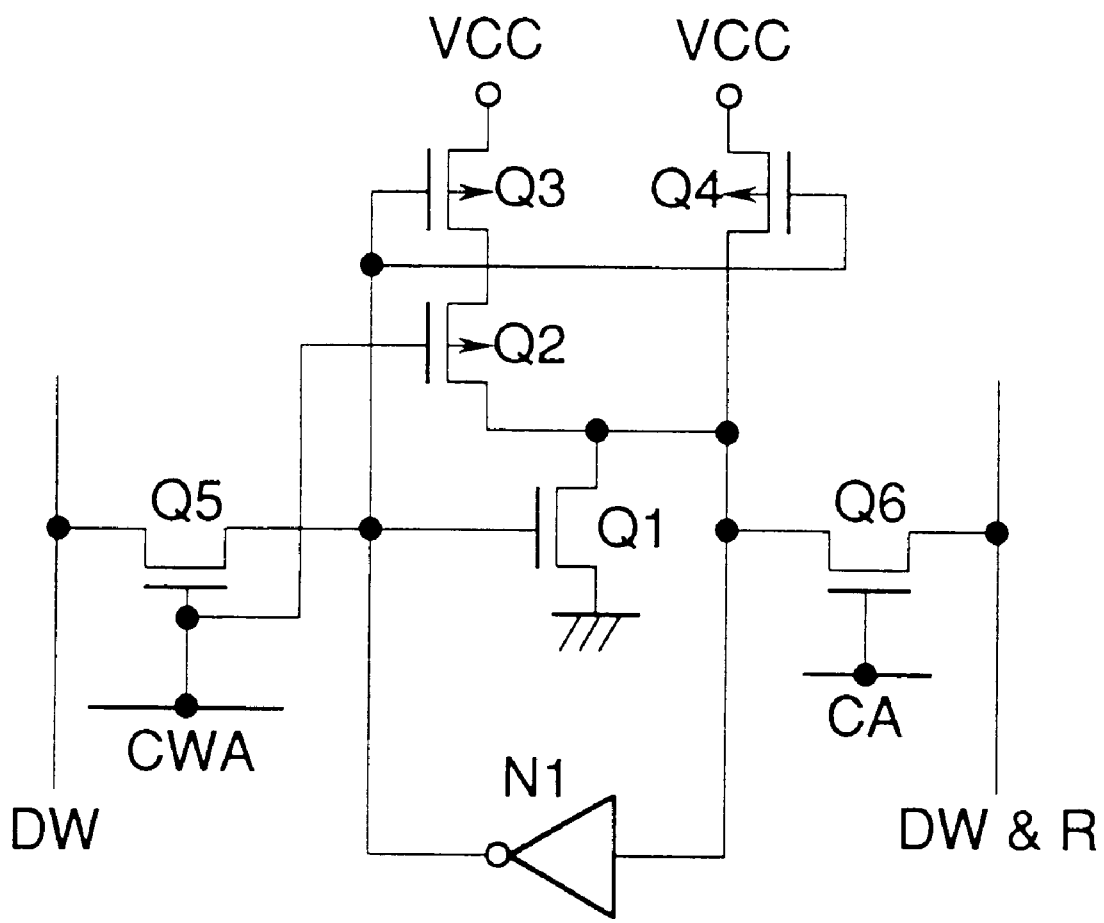
FIG. 29 shows a circuit diagram of still another embodiment of the present invention relating to a memory cell of a static type RAM.

FIG. 29 shows another embodiment of the present invention relating to a circuit diagram of still another memory cell in a static type RAM. In this embodiment, the output impedance of the driving inverter circuit is made variable. That is, the driving inverter circuit includes the two P-channel type MOSFETs Q3 and Q4 with respect to the N-channel type MOSFET Q1. In order to increase the output impedance during the write-in operation and decrease during the read-out operation, of the two of the P-channel type MOSFETs, the P-channel type MOSFET Q3 is connected in series with the P-channel type MOSFET Q2. Consequently, the P-channel type MOSFET Q4 and the P-channel type MOSFET Q2 and Q3, which are connected in series, are placed in between the drain of the N-channel type MOSFET Q1 and the power voltage Vcc. The gate of the P-channel type MOSFET Q2, which is made common with the gate of the write-in transfer MOSFET Q5, is supplied with the selective signal CWA.

In the memory cell of this embodiment, the selective signals CWA and CA are both made high during the write-in operation. Accordingly, the two transfer MOSFETs Q5 and Q6 are turned on. Then, the P-channel type MOSFET Q2 is turned off by the high level of the selective signal WCA. As a result, the driving inverter circuit is made to have a comparatively large output impedance of the N-channel type MOSFET Q1 and the P-channel type MOSFET Q4. From this, the latch circuit can rapidly switch in response to the complementary write-in data supplied from the data lines DW and DW&R even if the latch circuit has maintained the opposite level.

During the read-out operation, the signal CWA is maintained at the low level. By this low level of the signal CWA, the P-channel type MOSFET Q2 is made to be "on", and the output impedance, which is formed by the combination of the MOSFET Q4 and the MOSFETs Q2 and Q3, on the side of the P-channel is comparatively small. Consequently, since the output impedance of the driving inverter circuit is made small, the read-out in the selected memory cell is sped up; and in the unselected memory cell in which the data line is unselected by the selection of the word line, write-in errors by the maintained level of the unselected data line can be prevented.

Figure 30:
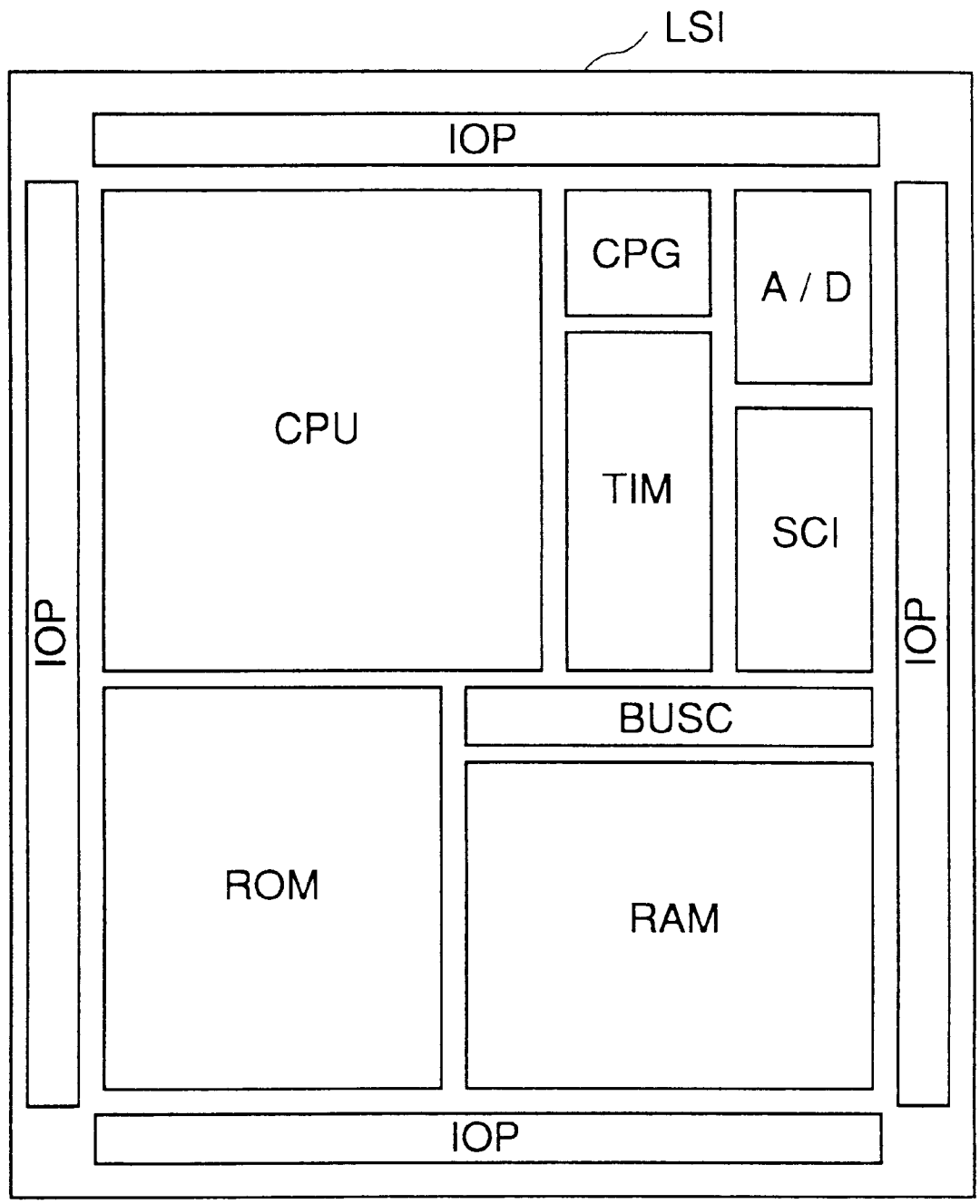
FIG. 30 is a block diagram of one embodiment of the present invention showing a single-chip microcomputer.

FIG. 30 shows another embodiment of the present invention relating to a block diagram of a single chip microcomputer. Each circuit block in this figure is drawn in accordance with the geometrical placements in the LSI semiconductor chip. The circuit elements that compose each of the blocks in the figure are formed on a semiconductor substrate, such as a single crystal silicon, using a well-known production technology of the semiconductor integrated circuit.

The single chip microcomputer of this embodiment has no particular limitations but comprises the central processing unit CPU of stored programs, the clock generating circuit CPG, the timer circuit TIM connected to the central processing unit CPU through the internal bus IBUS, the bus controller BUSC, the read-only-memory ROM, the random access memory of the present invention RAM, the serial communication interface SCI, and an A/D converter.

The central processing unit CPU is step controlled by the user programs stored in the read-only-memory ROM and organizes and controls each part of the microcomputer as predetermined arithmetic processing is executed at the same time. The clock generating circuit CPG is attached to the outer part of a crystal oscillator (not shown) through the outer terminal, forms a predetermined frequency clock signal, and supplies this to each of the parts of the microcomputer. The timer circuit TIM measures the time according to the clock signal supplied from the clock generating circuit CPG and accompanies the time management of the central processing unit CPU. The bus controller BUSC organizes the access of the internal bus IBUS and controls the input/output of information between the central processing unit CPU and each surrounding device.

The read-only-memory ROM is constituted by the mask ROM having a predetermined memory capacity and stores fixed data and programs necessary for the control of the central processing unit. The random access memory is constituted by the static type RAM having a predetermined memory capacity and stores temporarily control data and calculation results according to the central processing unit CPU. The serial communication interface SCI organizes or controls the input/output of data, for example, between the random access memory and serial output device connected to the outside part of the microcomputer or between this device and the central processing unit. The A/D converter converts the analog input signals sent from outside sensors (not shown), for example, through the outside terminals Ain to 10 bit digital signals, for example, and supplies to the central processing unit CPU or the random access memory RAM.

The microcomputer of this embodiment further has input/output ports IOP that serve as an interface with the outside devices. These input/output ports IOP are attached to the internal bus on one end and attached to the outside input/output devices such as a sensor on the other end.

The input/output ports IOP that include several bonding pads corresponding to the input/output terminals are placed at the four sides of the LSI semiconductor substrate. The central processing unit is placed at the upper left part of the area defined by the input/output IOP. The read-only-memory ROM derived from a mask ROM is placed bottom left part of the central processing unit CPU, the random access memory RAM which is a static type RAM is placed at the right side of the ROM. Above the random access memory RAM, the bus controller BUSC is placed. To the right side of the central processing unit, the clock generating circuit CPG and the timer circuit TIM are placed, and to the right of these, the A/D converter and the serial communication interface SCI are placed.

The central processing unit CPU with its advancement in speed requires a fast RAM. In regard to the static type RAM of the present invention, since it does not require a pre-charge time, the present invention is a profitably utilized as a memory suited for the sped-up central processing unit.

The effects that are derived from the above embodiment are as follows.

(1) In regard to the information storage part constituted by a pair of inverter circuits, which have inputs and outputs mutually cross-connected, a memory cell, which includes a pair of transfer MOSFETs in which only one of them is turned on during the read-out operation and both are turned on during the write-in operation, is placed in between the complementary data line and the input/output node with the complementary relationship; and with this memory cell in place, the speed up of the write-in becomes possible because of having a complementary write-in signal from the pair of complementary data lines during the write-in operation; and the achievement of rapid read-out signal and the prevention of write-in errors caused by the pre-read-out potential of the data line are realized because the information storage part is connected only to one of the data lines through one of the transfer gates during the read-out operation.

(2) In regard to the inverter circuit, which constitutes the information storage part to which the output signal is transmitted through the transfer gate MOSFET that is turned on during the read-out operation, as the output impedance becomes small in reference to that of the other inverter circuit, in which the inputs and outputs are cross-connected with those of the former inverter circuit, the speed-up of the read-out operation and the stabilization of storage during the unselected condition can be obtained.

(3) Regarding the pair of transistor gate MOSFET mentioned previously, these MOSFETs, corresponding to several pairs of the complementary data lines, are turned on simultaneously, and with the formation of the reset MOSFETs, which are formed for each data line and which are turned on momentarily at the beginning of the write-in operation, for the simplification of the selective circuit of memory cell, the prevention of write-in errors, in regard to the memory cell unselected by the data line, is obtained.

(4) In regard to the inverter circuit, which constitutes the information storage part to which the output signal is transmitted through the transfer gate MOSFET of the N-channel type that is turned on during the read-out operation, since the number 1 P-channel type MOSFET is connected in parallel with the number 2 and number 3 P-channel type MOSFETs, which are serially connected, and since the gate of the number 1 P-channel type MOSFET is connected to the gate of the N-channel type MOSFET as well as to those of the number 1 and number 2 P-channel type MOSFET, and since the gate of the number 3 P-channel type MOSFET is made common with the gate of the other transfer gate MOSFET, in respect to the stored information, the write-in speed of the switched information is increased by increasing the output impedance of the inverter circuit, mentioned above, during the write-in operation, and the read-out speed is increased by decreasing the output impedance during the read-out operation, and the stabilization is achieved in the unselected condition.

Although the description above contains many specificities, these should not be construed as limiting the scope of the invention but as merely providing illustrations of some of the presently preferred embodiments of the present invention. For example, the static type RAM of the present invention may be used in an logic integrated circuit like a gate array other than in the single chip microcomputer. High integration and high speed can be achieved in the logic integrated circuit constructed with the static type RAM of the present invention.

The results obtained by the representative embodiments of the present invention are as follows. That is, in regard to the information storage part constituted by a pair of inverters in which the inputs and outputs are cross-connected, with forming a memory cell, which has a pair of transfer MOSFET in which only one of them is turned one during the read-out operation, in between the complementary data line and the output/input node of complementary relationship, the speed up of the write-in becomes possible, and the effects of obtaining read-out signal rapidly and preventing write-in errors caused by the pre-read-out potential of the data line are achieved because the information storage part is connected only to one of the data lines through one of the transfer gates during the read-out operation.

The scope of the present invention should be determined by the appended claims and their legal equivalents, rather than by the examples give.

What is claimed is:

1. A semiconductor integrated circuit device comprising:

a semiconductor device formation layer on top of a circuit substrate,

PMOSs and NMOSs as semiconductor devices formed in said semiconductor device formation layer, a wiring layer on top of said semiconductor device formation layer, wiring lines and signal lines wired in said wiring layer, and contact holes for connecting the electrodes of said semiconductor devices and wiring lines in said wiring layer;

wherein two of said PMOSs as a smallest PMOS unit of a P-type semiconductor device are formed in the direction of a power line, wherein two of said NMOSs as a smallest NMOS unit of an N-type semiconductor device, adjoining said smallest PMOS unit in the perpendicular direction of said power line, are formed in the direction of said power line, wherein said PMOS unit of said PMOSs and said NMOS unit of said NMOSs form a pair, and two of said pairs form a basic cell such that the basic cell is comprised of a first PMOS unit, a first NMOS unit, a second PMOS unit and a second NMOS unit arranged relative to one another in an end-to-end relationship along a straight line in the direction perpendicular to the power line; wherein gate electrodes of said semiconductor devices are formed in the direction perpendicular to said power line, wherein the gate electrodes of each of the PMOS units are formed as separate electrodes which are not integral with the gate electrodes of the other PMOS units, and wherein the gate electrodes of each of the NMOS units are formed as separate electrodes which are not integral with the gate electrodes of other NMOS units, wherein, within a MOS channel width of each of said semiconductor devices, at least four of said contact holes are provided such that one of said contact holes is connected to said power line or a ground line, two of said contact holes are provided on one side of said power line or said ground line and one of said contact holes is provided on the other side of said power line or said ground line, wherein said contact holes are formed in a straight line perpendicular to said power line, wherein said power line has the same width as a signal line width in said wiring layer, and wherein the arrangement of the first and second PMOS and NMOS units to form said basic cells permits preferential wiring with said signal lines of adjacent PMOS and NMOS semiconductor devices to one another within said basic cells.

2. A semiconductor integrated circuit device comprising:

a semiconductor device formation layer on top of a circuit substrate,

PMOSs and NMOSs as semiconductor devices formed in said semiconductor device formation layer, a wiring layer on top of said semiconductor device formation layer, wiring lines and signal lines wired in said wiring layer, and contact holes for connecting the electrodes of said semiconductor devices and said wiring lines in said wiring layer;

wherein, two of said PMOSs as a smallest PMOS unit of a P-type semiconductor device are formed in the direction of a power line; wherein two of said NMOSs as a smallest NMOS unit of an N-type semiconductor device, adjoining said smallest PMOS unit in the direction perpendicular to said power line, are formed in the direction of said power line; wherein said PMOS unit of said PMOSs and said NMOS unit of said NMOSs form a pair, and two of said pairs form a basic cell such that the basic cell is comprised of a first PMOS unit, a first NMOS unit, a second PMOS unit and a second NMOS unit arranged relative to one another in an end-to-end relationship along a straight line in the direction perpendicular to the power line; wherein the gate electrodes of said semiconductor devices are formed in the direction perpendicular to said power line, wherein the gate electrodes of each of the PMOS units are formed as separate electrodes which are not integral with the gate electrodes of the other PMOS units, and wherein the gate electrodes of each of the NMOS units are formed as separate electrodes which are not integral with the gate electrodes of other NMOS units; wherein, within a MOS channel width of each of said semiconductor devices, at least four of said contact holes are provided such that one of said contact holes is connected to said power line or a ground line, two of said contact holes are provided on one side of said power line or said ground line and one of said contact holes is provided on the other side of said power line or said ground line, wherein said contact holes are formed in a straight line perpendicular to said power line, wherein said power line has the same width as a signal line width in said wiring layer, and wherein, in the case of forming a logic gate using said basic cell, a circuit is formed by each pair of said semiconductor devices within said basic cell, and the output part of said logic gate has MOSs connected in parallel, and wherein the arrangement of the first and second PMOS and NMOS units to form said basic cells permits preferential wiring with said signal lines of adjacent PMOS and NMOS semiconductor devices to one another within said basic cells.

3. The semiconductor integrated circuit device according to claim 1, wherein each pair of said semiconductor devices which comprises said basic cell is placed in the direction perpendicular to said power line, and the length of said basic cell perpendicular to said power line is set to have a wiring pitch of between 24 and 30, inclusive.

4. The semiconductor integrated circuit device according to claim 2, wherein each pair of said semiconductor devices which comprises said basic cell is placed in the direction perpendicular to said power line, and the length of said basic cell perpendicular to said power line is set to have a wiring pitch of between 24 and 30, inclusive.

5. The semiconductor integrated circuit device according to claim 1, wherein, the gate electrodes of said PMOSs and the gate electrodes of said NMOSs are mutually separated.

6. The semiconductor integrated circuit device according to claim 2, wherein, the gate electrodes of said PMOSs and the gate electrodes of said NMOSs are mutually separated.

7. The semiconductor integrated circuit device according to claim 1, wherein, the gate electrodes of a PMOS and an NMOS, which make up a pair and which are the elements of said basic cell, are mutually connected.

8. The semiconductor integrated circuit device according to claim 2, wherein, the gate electrodes of a PMOS and an NMOS, which make up a pair and which are the elements of said basic cell, are mutually connected.

9. The semiconductor integrated circuit device according to claim 1, wherein, said semiconductor devices which comprise said basic cell are formed in the direction perpendicular to a plurality of power lines, and wherein a diffusion layer domain group with a fixed potential well is provided for the basic cells.

10. The semiconductor integrated circuit device according to claim 2, wherein, said semiconductor devices which comprise said basic cell are formed in the direction perpendicular to a plurality of power lines, and wherein a diffusion layer domain group with a fixed potential well is provided for the basic cells.

11. The semiconductor integrated circuit device according to claim 1, wherein, besides said PMOSs and NMOSs, bipolar transistors placed near one of said MOSs are included as said semiconductor devices.

12. The semiconductor integrated circuit device according to claim 2, wherein, besides said PMOSs and NMOSs, bipolar transistors placed near one of said MOSs are included as said semiconductor devices.

* * * * *